United States Patent
Shiga et al.

(10) Patent No.: US 7,843,724 B2
(45) Date of Patent: Nov. 30, 2010

(54) NONVOLATILE SEMICONDUCTOR MEMORY AND DATA READING METHOD

(75) Inventors: Hitoshi Shiga, Yokohama (JP); Susumu Fujimura, Fujisawa (JP); Yoshihiko Shindo, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 460 days.

(21) Appl. No.: 11/863,915

(22) Filed: Sep. 28, 2007

(65) Prior Publication Data

US 2008/0239805 A1    Oct. 2, 2008

(30) Foreign Application Priority Data

Sep. 28, 2006    (JP)    ............... 2006-265744

(51) Int. Cl.
    *G11C 7/00*    (2006.01)
(52) U.S. Cl. ............... 365/185.03; 365/185.22; 365/210.1
(58) Field of Classification Search ............ 365/185.03, 365/185.18, 185.22, 185.24, 189.07, 189.09, 365/210

See application file for complete search history.

(56) References Cited

U.S. PATENT DOCUMENTS

| | | | |
|---|---|---|---|
| 5,790,454 A * | 8/1998 | Choi | ............... 365/185.03 |
| 6,657,891 B1 | 12/2003 | Shibata et al. | |
| 6,879,520 B2 | 4/2005 | Hosono et al. | |
| 2006/0227624 A1* | 10/2006 | Shiga | ............... 365/189.01 |
| 2008/0013371 A1* | 1/2008 | Shiga | ............... 365/185.03 |
| 2009/0010063 A1* | 1/2009 | Shiga | ............... 365/185.12 |

FOREIGN PATENT DOCUMENTS

| | | |
|---|---|---|
| JP | 2004-192789 | 7/2004 |
| JP | 2004-326866 | 11/2004 |

OTHER PUBLICATIONS

U.S. Appl. No. 12/534,336, filed Aug. 3, 2009, Futatsuyama, et al.

* cited by examiner

*Primary Examiner*—VanThu Nguyen
*Assistant Examiner*—Douglas King
(74) *Attorney, Agent, or Firm*—Oblon, Spivak, McClelland, Maier & Neustadt, L.L.P.

(57) ABSTRACT

A nonvolatile semiconductor memory that includes a memory cell array including a plurality of electrically writable memory cells; a plurality of word lines and a plurality of bit lines connected to the plurality of memory cells; and a data reading and programming control section. The data reading and programming cortrol section includes: an adjacent memory cell data reading section; an adjacent memory cell data memory section; a reading voltage level control section; a data reading section for reading the data from a first memory cell at a plurality of reading voltages corresponding to a plurality of predetermined reading voltage verify levels controlled using the reading voltage level control section; and a data determining section for deterraining which data of 4-value data is programmed in the first memory cell based on the data which is read by the data reading section.

22 Claims, 34 Drawing Sheets

Before data is programmed in WLn+1 (MCn+1)

After data is programmed in WLn+1 (MCn+1)

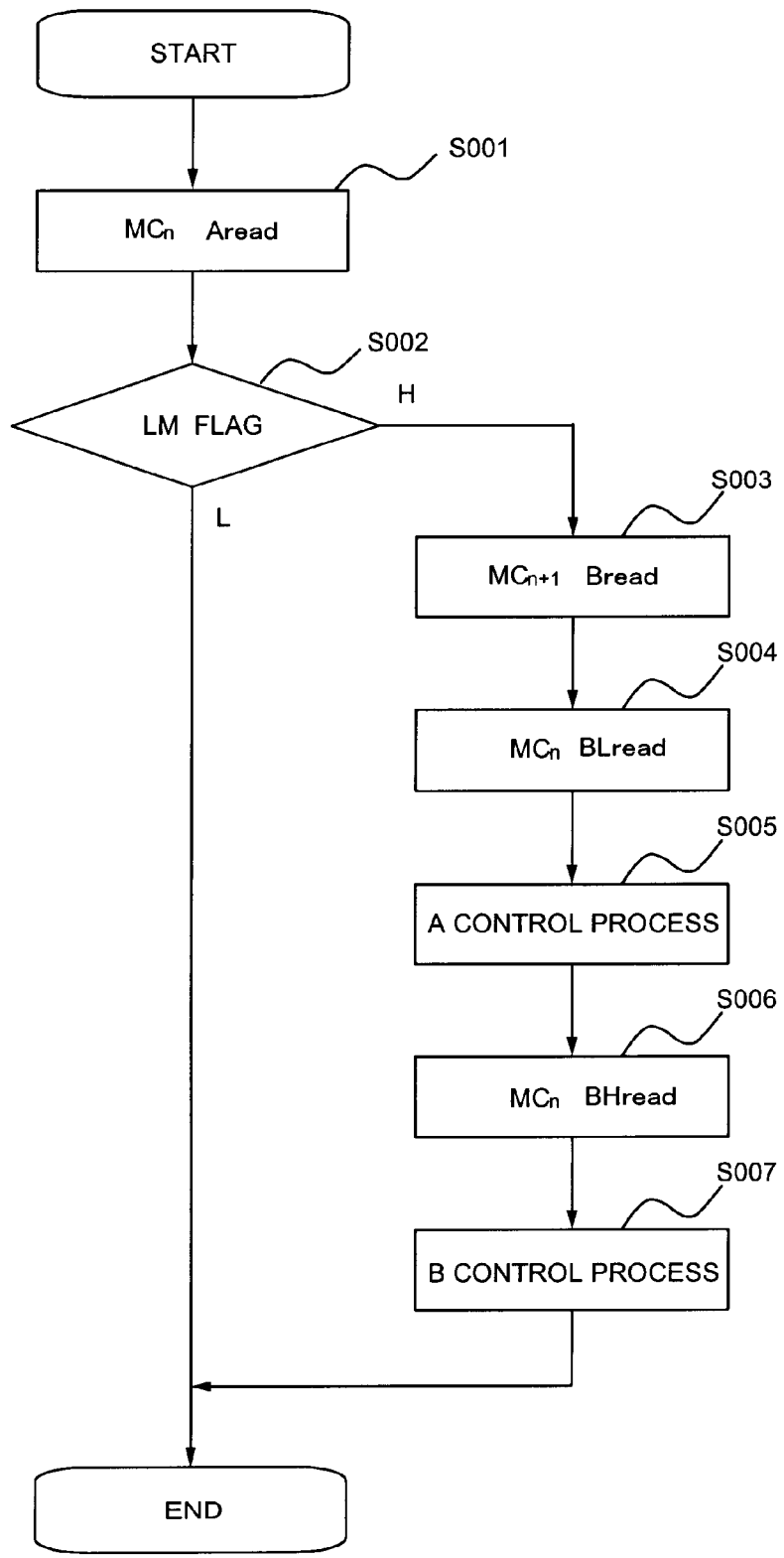

Before programming to WLn+1

After programming to WLn+1

Aread  BLread  CLread
       BHread  CHread

Before programming to WLn+1

After programming to WLn+1

Bread

FIG.18

| MCn+1 Bread | "H" | | | | "L" | | | |
|---|---|---|---|---|---|---|---|---|
| MCn BLread | "H" | | "L" | | "H" | | "L" | |
| A control process result | "H" | | "L" | | "H" | | "L" | |
| MCn BHread | "H" | "L" | "H" | "L" | "H" | "L" | "H" | "L" |
| B control process result | — | "L" | "H" | "L" | — | "L" | "H" | "L" |

FIG.19

| MCn+1 Bread | "H" | | | "L" | | | |
|---|---|---|---|---|---|---|---|
| MCn CLread | "H" | "L" | "L" | "H" | "H" | "L" | "L" |
| A control process result | "H" | "L" | "L" | "H" | "H" | "L" | "L" |
| MCn CHread | "H" | "L" | "H" | "H" | "L" | "H" | "L" |
| B control process result | "H" | "H" | — | "L" | "H" | — | "L" |

FIG.23

| MCn+1 A B CLread | "H" | | | | "L" | | | |
|---|---|---|---|---|---|---|---|---|
| MCn CLread | "H" | | "L" | | "H" | | "L" | |
| A control process result | "H" | | "L" | | "H" | | "L" | |
| MCn CHread | "H" | "L" | "H" | "L" | "H" | "L" | "H" | "L" |
| B control process result | "H" | "H" | — | "L" | "H" | "H" | — | "L" |

FIG.24

| | MCn+1 ABCLread = "H" | | | | MCn+1 ABCLread = "L" | | | |
|---|---|---|---|---|---|---|---|---|
| MCn ALread | "H" | "H" | "L" | "L" | "H" | "H" | "L" | "L" |
| A control process result | "L" | "L" | "L" | "L" | "H" | "H" | "L" | "L" |
| MCn BHread | "H" | "L" | "H" | "L" | "H" | "L" | "H" | "L" |
| B control process result | "H" | — | "L" | "L" | "H" | — | "L" | "L" |

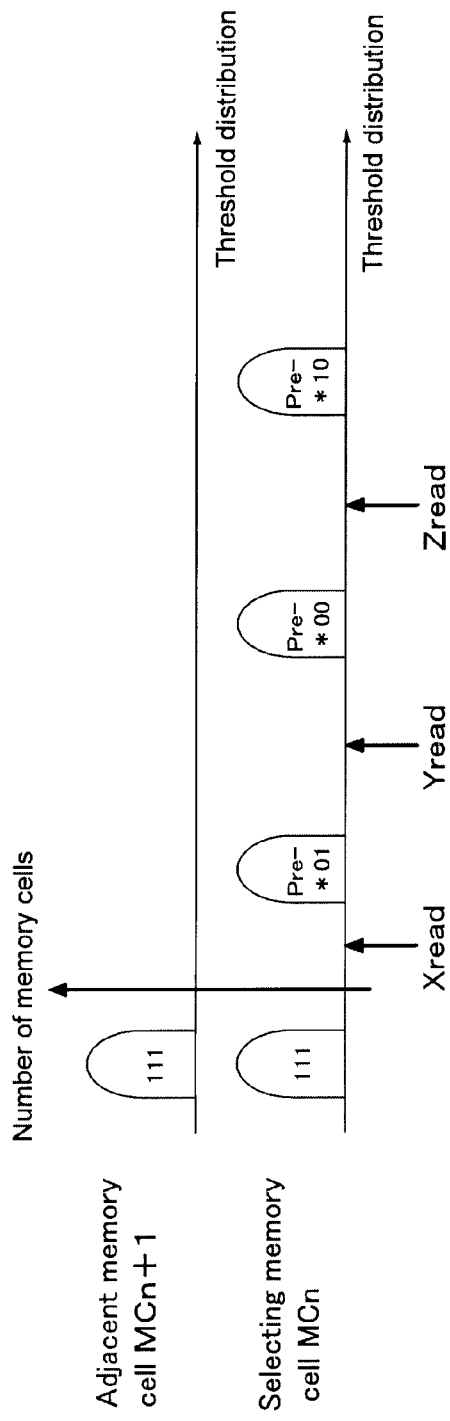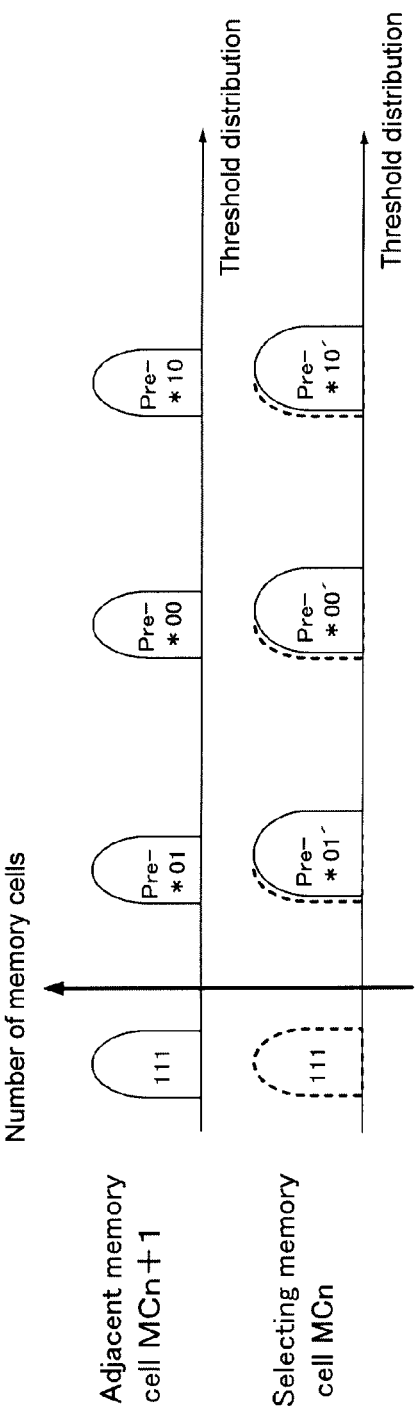

NONVOLATILE SEMICONDUCTOR MEMORY AND DATA READING METHOD

CROSS REFERENCE TO RELATED APPLICATION

This application is based upon and claims the benefit of priority from the prior Japanese Patent Application No. 2006-265744, filed on Sep. 28, 2006; the entire contents of which are incorporated herein by reference.

BACKGROUND OF THE INVENTION

1. Field of the Invention

The present invention relates to a nonvolatile semiconductor memory including a memory cell array which includes a plurality of electrically rewritable memory cells, and a data reading method.

2. Description of the Related Art

Recently, a demand for compact and large-capacity nonvolatile semiconductor memories has been rapidly increased. Among them, a NAND type flash memory expected to be integrated to a higher degree and to have a larger capacity than a conventional NOR type flash memory has been a center of attention. A NAND type flash memory includes a plurality of memory cells, having a floating gate, which are connected in series, and can act as a memory by programming data to, or reading data from, each of the memory cells.

The NAND type flash memory, however, has a problem that along the recent increase in the integration degree, the size of the structure has been more and more reduced, which causes a capacitance to be formed between floating gates of adjacent memory cells and thus generates noise.

One technology for suppressing the noise is a nonvolatile semiconductor memory described in, for example, Japanese Laid-Open Patent Publication No. 2004-326866. The nonvolatile semiconductor memory includes a memory cell array and a plurality of sense amplifier circuits. The memory cell array includes electrically rewritable, floating gate type memory cells. The plurality of sense amplifier circuits are provided for reading data from the memory cell array.

Each sense amplifier circuit senses cell data in a first memory cell selected from the memory cell array, under a reading condition which is determined in accordance with data in a second memory cell which is adjacent to the first memory cell and to which data is programmed after data is programmed to the first memory cell.

For example, Japanese Laid-Open Patent Publication No. 2004-192789 describes a technology, by which before data is stored on a memory cell having i-bit data stored thereon, i-bit or less amount of data is programmed to a memory cell adjacent thereto.

However, these technologies also have a problem that coupling noise needs to be suppressed more efficiently.

BRIEF SUMMARY OF THE INVENTION

A nonvolatile semiconductor memory according to one embodiment of the present invention includes:

a memory cell array including a plurality of electrically writable memory cells;

a plurality of word lines and a plurality of bit lines connected to the plurality of memory cells; and a data reading and programming control section for, when performing 4-value data programming, read or erasure with respect to at least one of the plurality of memory cells, selecting and applying a voltage to a corresponding word line and a corresponding bit line among the plurality of word lines and the plurality of bit lines;

wherein the data reading and programming control section includes:

an adjacent memory cell data reading section for reading, at a reading voltage of a predetermined reading voltage level, whether or not data is programmed in a lower page of a second memory cell adjacent to a first memory cell in the memory cell array, and generating adjacent memory cell state data which represents a data state of the second memory cell;

an adjacent memory cell data memory section for storing the adjacent memory cell state data generated by the adjacent memory cell data reading section;

a reading voltage level control section for defining a plurality of predetermined reading voltage verify levels for reading data from the first memory cell based on the adjacent memory cell state data;

a data reading section for reading the data from the first memory cell at a plurality of reading voltages corresponding to the plurality of predetermined reading voltage verify levels; and a data determining section for determining which data of 4-value data is programmed in the first memory cell based on the data which is read by the data reading section.

A nonvolatile semiconductor memory according to one embodiment of the present invention includes:

a memory cell array including a plurality of electrically writable memory cells;

a plurality of word lines and a plurality of bit lines connected to the plurality of memory cells; and a data reading and programming control section for, when performing 8-value data programming, read or erasure with respect to at least one of the plurality of memory cells, selecting and applying a voltage to a corresponding word line and a corresponding bit line among the plurality of word lines and the plurality of bit lines;

wherein the data reading and programming control section includes:

an adjacent memory cell data reading section for reading, at a reading voltage of a predetermined reading voltage level, whether or not data is programmed in a lower page and a middle page of a second memory cell adjacent to a first memory cell in the memory cell array, and generating adjacent memory cell state data which represents a data state of the second memory cell;

an adjacent memory cell data memory section for storing the adjacent memory cell state data generated by the adjacent memory cell data reading section;

a reading voltage level control section for defining a plurality of predetermined reading voltage verify levels for reading data from the first memory cell based on the adjacent memory cell state data;

a data reading section for reading the data from the first memory cell at a plurality of reading voltages corresponding to the plurality of predetermined reading voltage verify levels; and a data determining section for determining which data of 8-value data is programmed in the first memory cell based on the data which is read by the data reading section.

A data reading method according to one embodiment of the present invention is a data reading method in a nonvolatile semiconductor memory, the nonvolatile semiconductor memory including:

a memory cell array including a plurality of electrically writable memory cells;

a plurality of word lines and a plurality of bit lines connected to the plurality of memory cells; and a data reading and programming control section for, when performing 4-value data programming, read or erasure with respect to at least one of the plurality of memory cells, selecting and applying a voltage to a corresponding word line and a corresponding bit line among the plurality of word lines and the plurality of bit lines;

the method comprising:

reading, at a reading voltage of a predetermined reading voltage level, whether or not data is programmed in a lower page of a second memory cell adjacent to a first memory cell in the memory cell array, and generating adjacent memory cell state data which represents a data state of the second memory cell;

storing the adjacent memory cell state data in an adjacent memory cell data memory section;

defining a plurality of predetermined reading voltage verify levels for reading data from the first memory cell based on the adjacent memory cell state data stored on the adjacent memory cell data memory section;

reading the data from the first memory cell at a plurality of reading voltages corresponding to the plurality of predetermined reading voltage verify levels; and determining which data of 4-value data is programmed in the first memory cell based on the data which is read by the data reading section.

BRIEF DESCRIPTION OF THE DRAWINGS

FIG. 11A shows that a threshold distribution is changed by coupling generated between adjacent floating gates in the NAND type flash memory according to Embodiment 1 of the present invention.

FIG. 11B shows that a threshold distribution is changed by coupling generated between adjacent floating gates in the NAND type flash memory according to Embodiment 1 of the present invention.

FIG. 12 is a flowchart showing a reading operation on a lower page in the NAND type flash memory according to Embodiment 1 of the present invention.

FIG. 18 shows combinations of levels in a reading operation on a lower page in the NAND type flash memory according to Embodiment 1 of the present invention.

FIG. 19 shows combinations of levels in a reading operation on an upper page in the NAND type flash memory according to Embodiment 1 of the present invention.

FIG. 23 shows combinations of levels in a reading operation on a lower page in the NAND type flash memory according to Embodiment 2 of the present invention.

FIG. 24 shows combinations of levels in a reading operation on an upper page in the NAND type flash memory according to Embodiment 2 of the present invention.

FIG. 31A shows a threshold distribution in a selecting memory cell in the NAND type flash memory according to Embodiment 5 of the present invention, before data is programmed to an adjacent memory cell adjacent the selecting memory cell.

FIG. 31B shows a threshold distribution in the adjacent memory cell and the selecting memory cell in the NAND type flash memory according to Embodiment 5 of the present invention, after data is programmed to the adjacent memory cell.

DETAILED DESCRIPTION OF THE INVENTION

Figure 1:
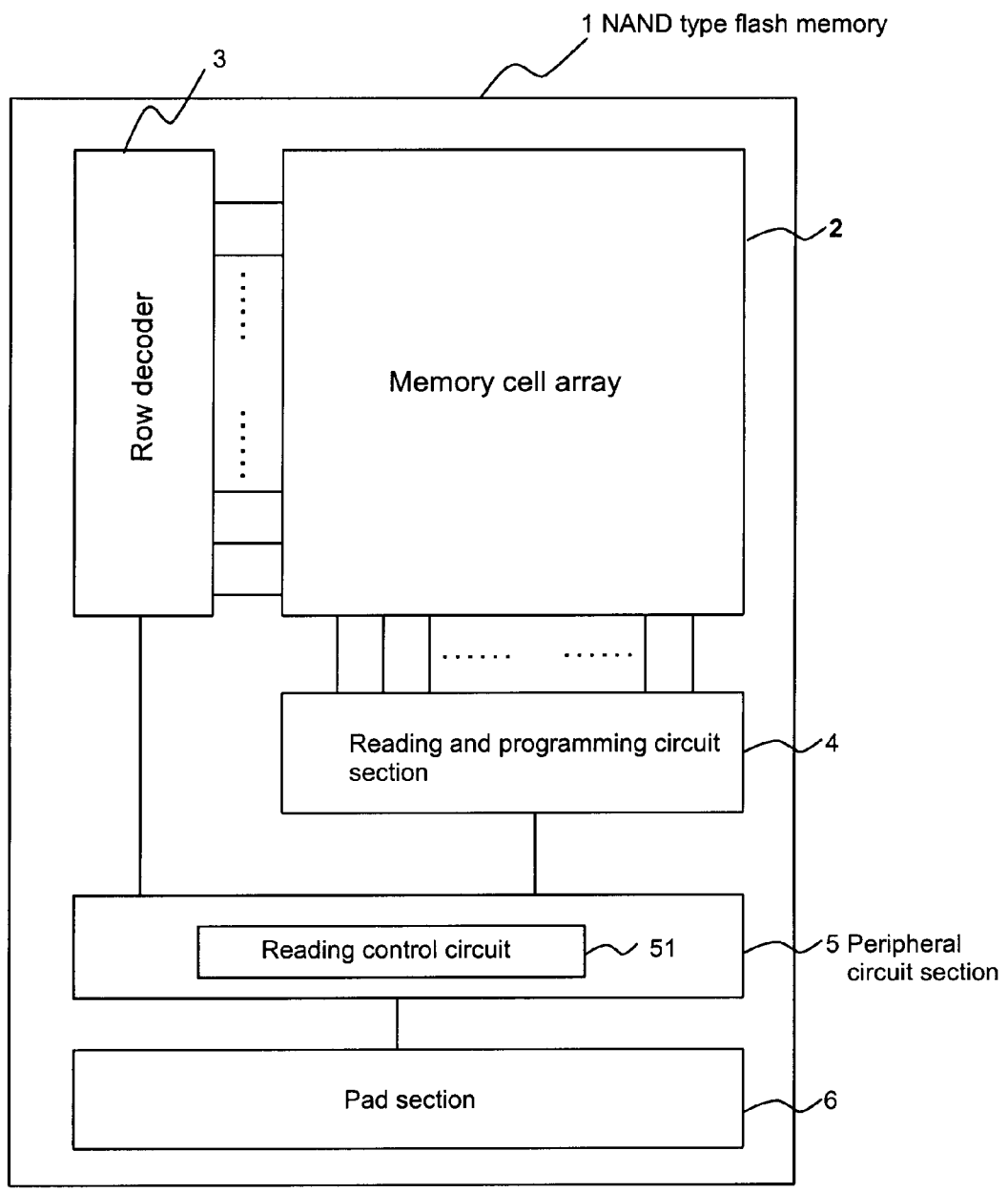
FIG. 1 is a schematic block diagram showing a NAND type flash memory according to Embodiment 1 of the present invention.

Hereinafter, embodiments of the present invention will be described in detail with reference to the drawings. The present invention is not limited to the following embodiments. In this specification, elements having the same or similar functions bear the same reference numerals, and detailed descriptions thereof will not be repeated.

Embodiment 1

FIG. 1 is a schematic block diagram of a NAND type flash memory 1 according to Embodiment 1 of a nonvolatile semiconductor memory according to the present invention.

As shown in FIG. 1, the NAND type flash memory 1 according to Embodiment 1 includes a memory cell array 2, a row decoder 3, a reading and programming circuit section 4, a peripheral circuit section 5 and a pad section 6.

Figure 2:
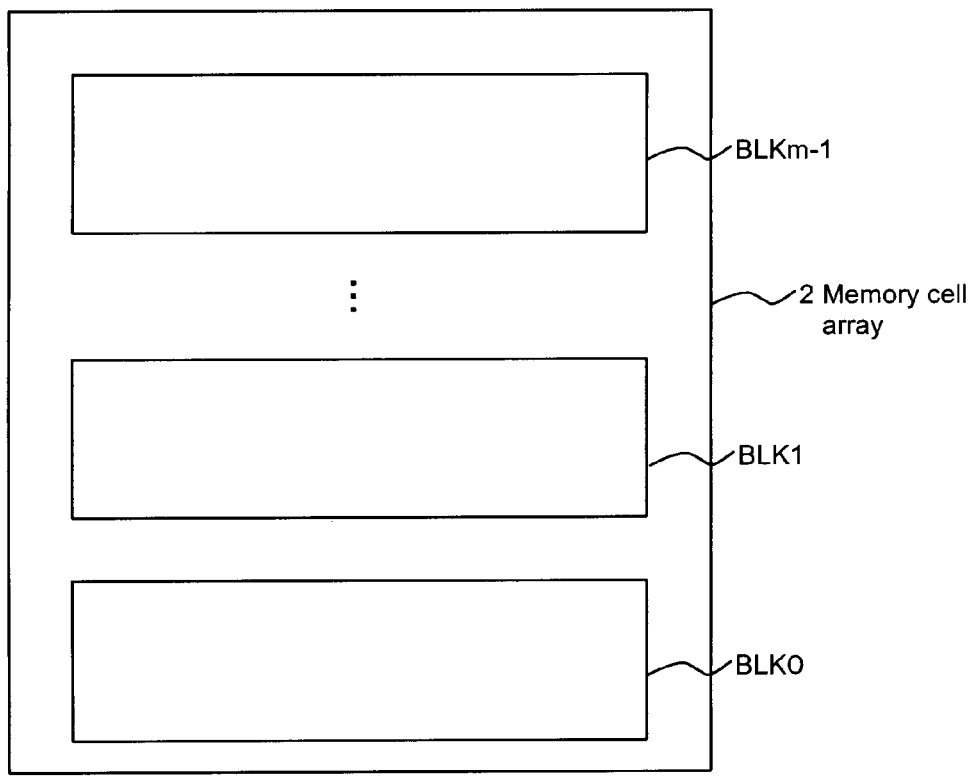
FIG. 2 is a schematic block diagram showing a memory cell array in the NAND type flash memory according to Embodiment 1 of the present invention.

The memory cell array 2 according to Embodiment 1 includes a plurality of electrically rewritable memory cells arranged in a matrix. FIG. 2 is a schematic block diagram showing a structure of the memory cell array 2 according to Embodiment 1. As shown in FIG. 2, the memory cell array 2 according to Embodiment 1 includes a plurality of (m pieces of) memory cell blocks BLK0, BLK1, ..., BLKm−1. Here, the "memory cell block" is a minimum unit, based on which data is erasable in one lot.

Figure 3:
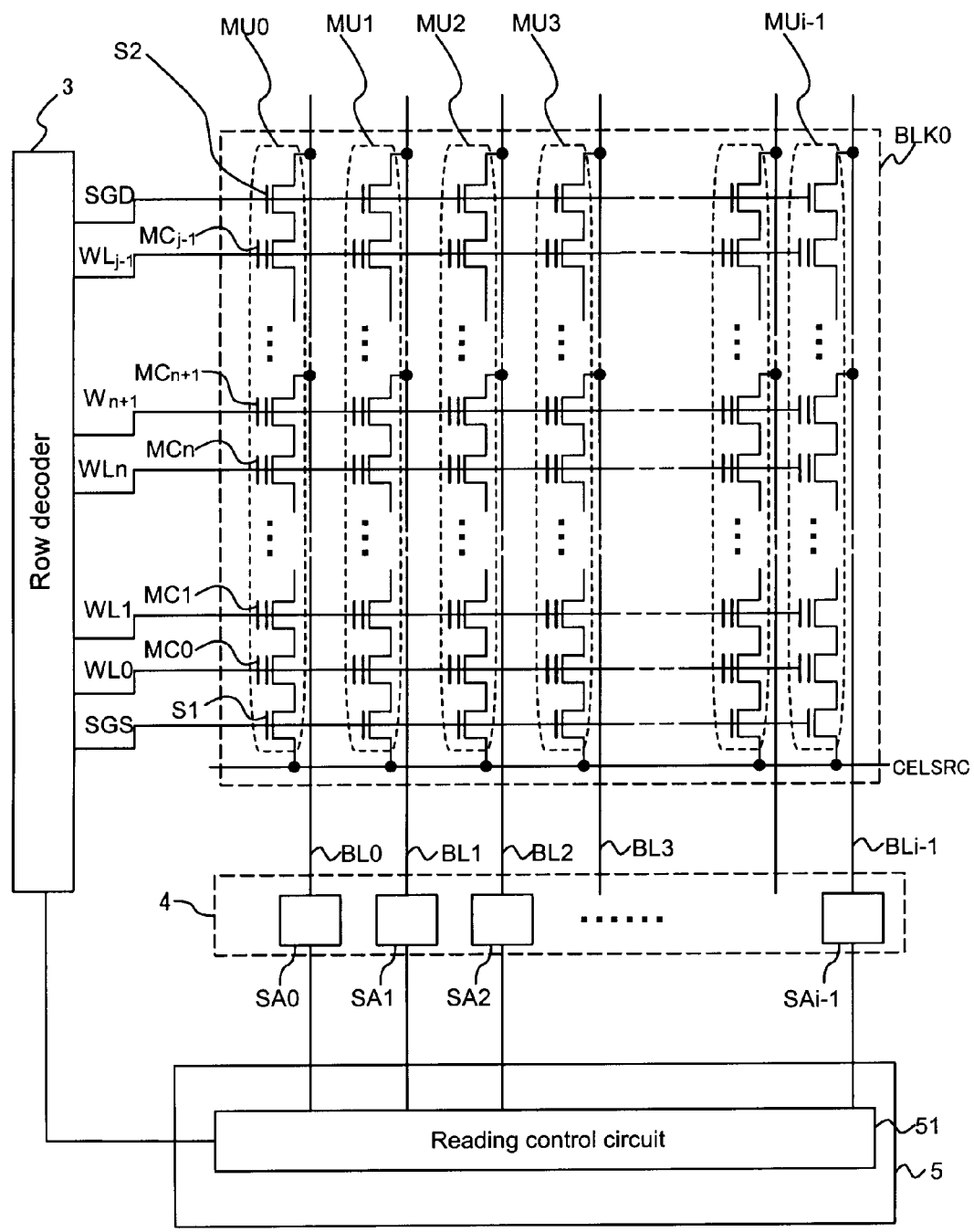
FIG. 3 is a schematic block diagram showing a structure of a memory cell block in the NAND type flash memory according to Embodiment 1 of the present invention.

FIG. 3 is a block diagram showing an exemplary, more detailed structure of one of the plurality of memory cell blocks BLK0, BLK1, ..., BLKm−1 (for example, memory cell block BLK0) according to Embodiment 1. As shown in FIG. 3, each of the memory cell blocks BLK0, BLK1, ..., BLKm−1 includes a plurality of (i pieces of) memory cell units MU0, MU1, ..., MUi−1. Each of the memory cell units MU0, MU1, ..., MUi−1 includes a plurality of (j pieces of) memory cells MC0, MC1, ..., MCj−1 and selecting transistors S1 and S2. The plurality of (j pieces of) memory cells MC0, MC1, ..., MCn, MCn+1, ..., MCj−1 are connected in series, such that each adjacent memory cells have a common source region or a drain region. The selecting transistor S1 is connected to one end (source region side) of a series connection unit of the memory cells MC0, MC1, ..., MCn, MCn+1, ..., MCj−1. The selecting transistor S2 is connected to the other end (drain region side) of the series connection unit of the memory cells MC0, MC1, ..., MCn, MCn+1, ..., MCj−1.

Each of the memory cell blocks BLK0, BLK1, ..., BLKm−1 includes a plurality of (for example, two) gate lines SGS and SGD, a plurality of (j pieces of) word lines WL0, WL1, ..., WLj−1, and a plurality of (i pieces of) bit lines BL0, BL1, ..., BLi−1.

The plurality of (j pieces of) word lines WL0, WL1, ..., WLn, WLn+1, WLj−1 are located along the gate lines SGS and SGD. The plurality of (i pieces of) bit lines BL0, BL1, ..., BLi−1 are located so as to cross the gate lines SGS and SGD and the plurality of word lines WL0, WL1, ..., WLn, WLn+1, WLj−1.

The gate line SGS is commonly connected to a gate of the selecting transistor S1 in each of the memory cell units MU0, MU1, ..., MUi−1 in each of the memory cell blocks BLK0, BLK1, ..., BLKm−1. The gate line SGD is commonly connected to a gate of the selecting transistor S2 in each of the memory cell units MU0, MU1, ..., MUi-1 in each of the memory cell blocks BLK0, BLK1, ..., BLKm−1.

Each of the plurality of bit lines BL0, BL1, ..., BLi−1 is connected to the drain region of the selecting transistor S2 of a corresponding memory cell unit among the plurality of memory cell units MU0, MU1, ..., MUi-1. The source region of the selecting transistor S1 is connected to a common cell source line CELSRC common to the plurality of memory cell blocks BLK0, BLK1, ..., BLKm−1.

Each of the memory cells MC0, MC1, ..., MCj−1 in each of the memory cell blocks BLK0, BLK1, ..., BLKm−1 is commonly connected to memory cells at a similar electric connection position in the other memory cell units via the corresponding word line.

In Embodiment 1, the plurality of word lines WL0, WL1, ..., WLj−1 and the gate lines SGS and SGD in each of the memory cell blocks BLK0, BLK1, .... BLKm−1 are connected to the row decoder 3 external to the memory cell array 2. The plurality of bit lines BL0, BL1, ..., BLi−1 are respectively connected to a plurality of (i pieces of) sense amplifier circuits SA0, SA1, ..., SAi−1 in the reading and programming circuit section 4 external to the memory cell array 2.

The reading and programming circuit section 4 includes the sense amplifier circuits SA0, SA1, ..., SAi−1. The peripheral circuit section 5 includes a reading control circuit 51. The reading control circuit 51 is connected to the plurality of (i pieces of) sense amplifier circuits SA0, SA1, ..., SAi−1 and the row decoder 3. The reading control circuit 51 controls the plurality of (i pieces of) sense amplifier circuits SA0, SA1, ..., SAi−1 and the row decoder 3 to read data from each of the memory cells MC0, MC1, ..., MCn, MCn+1, ..., MCj−1.

The reading and programming control circuit section 4 and the reading control section 51 form a data reading and programming control section for, when performing 4-value data programming, read and erasure with respect to the plurality of memory cells MC0, MC1, ..., MCn, MCn+1, ..., MCj−1, selecting and applying a voltage to a corresponding word line and a corresponding bit line among the plurality of word lines WL0, WL1, ..., WLn, WLn+1, ..., WLj−1 and the plurality of bit lines BL0, BL1, ..., BLi−1.

Figure 4:
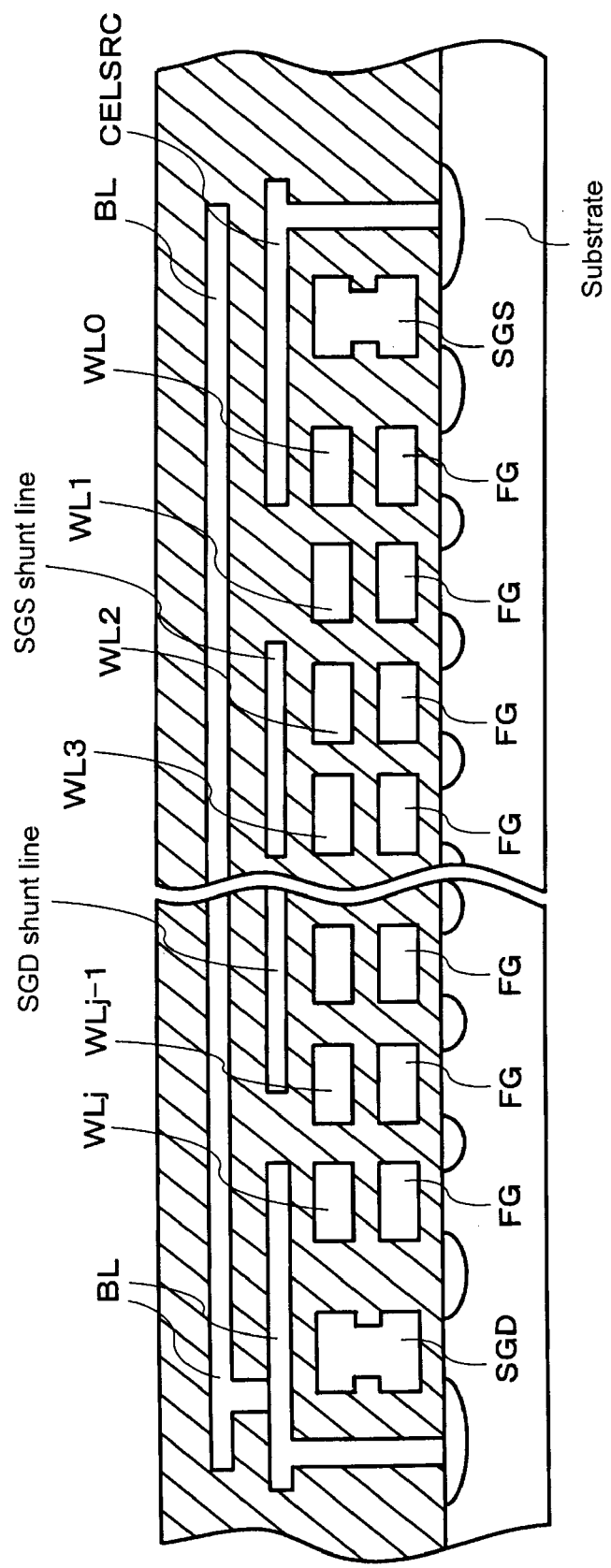
FIG. 4 is a schematic partial cross-sectional view of a memory cell unit in the NAND type flash memory according to Embodiment 1 of the present invention.

FIG. 4 shows a partial cross-sectional view of the NAND type flash memory 1 according to Embodiment 1 of the present invention. FIG. 4 is a cross-sectional view along a bit line of one memory cell unit in the NAND type flash memory 1 according to Embodiment 1. As shown in FIG. 4, the NAND type flash memory 1 includes a substrate, a plurality of floating gates FG and the selecting gate lines SGS and SGD which are provided on the substrate with an interlayer insulation layer interposed therebetween, and the word lines WL0, WL1, ..., WLn, WLn+1, ..., WLj−1 which are provided on the floating gates FG with an interlayer insulation layer interposed therebetween.

In the substrate, diffusion layers each provided commonly to each adjacent floating gates and acting as a source/drain layer of the corresponding memory cell are formed. Using such a structure, the NAND type flash memory 1 applies a voltage between a word line and a channel to control the amount of charge to be accumulated in each floating gate and to change a threshold distribution in the floating gate. In this way, the NAND type flash memory 1 can store 4-value data thereon.

The NAND type flash memory 1 performs a data programming operation and a data reading operation using such a structure. Such operations will be briefly described with reference to FIG. 5 and FIG. 6.

Figure 5:
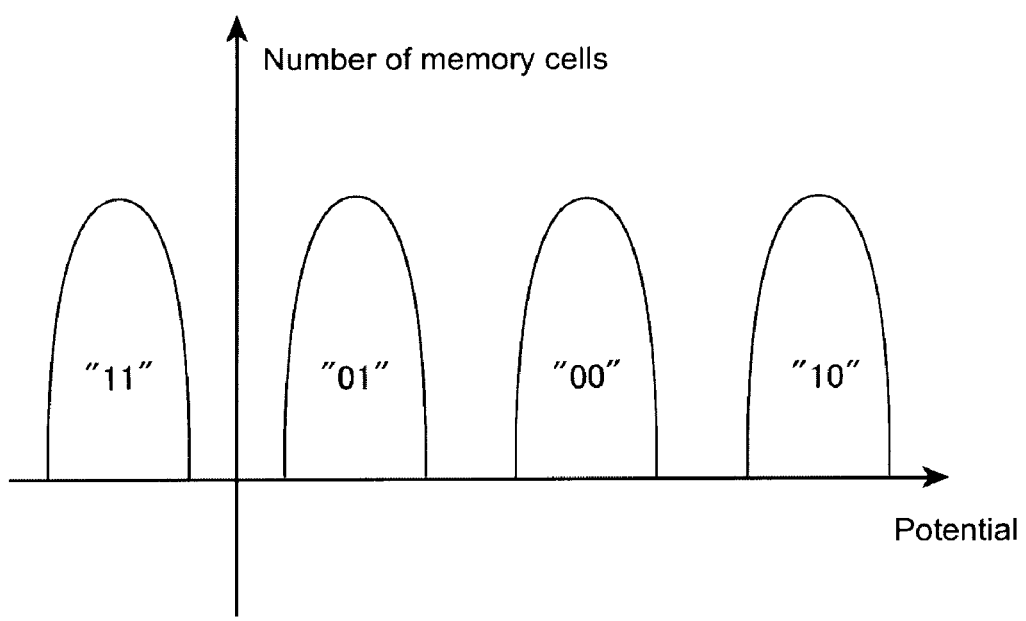
FIG. 5 shows a threshold distribution in a floating gate of a memory cell in the NAND type flash memory according to Embodiment 1 of the present invention.

FIG. 5 shows a threshold distribution in the floating gate of one memory cell in the NAND type flash memory 1. As described above, the NAND type flash memory 1 can program data by applying a voltage between a word line and a channel to inject charges to the floating gate of the memory cell and thus to change the threshold distribution in the floating gate. The NAND type flash memory 1 can also read data by making a determination on the threshold distribution.

Namely, for example, as shown in FIG. 5, four states ("11", "01", "00", "10" from the left of the figure) are provided for the threshold distribution in the floating gate, and 2-bit (4-value) data can be stored on a memory cell by placing the floating gate into any one of the four states.

The above representation indicates that two data (2-digit data) are programmed to a memory cell in the NAND type flash memory 1. Hereinafter, first data (in the case of "01" above, "1" on the right digit) will be referred to as the "lower page", and second data (in the case of "01" above, "0" on the left digit) will be referred to as the "upper page".

The state shown in FIG. 5 is realized by, for example, a programming operation shown in FIG. 6A through FIG. 6D. First, an example of placing the threshold distribution into the "10" state will be described.

Figure 6A:
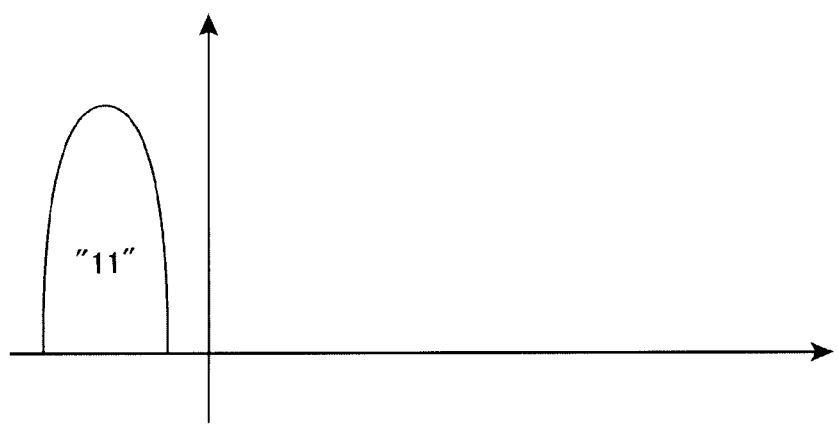
FIG. 6A shows a data programming operation on a memory cell in the NAND type flash memory according to Embodiment 1 of the present invention.
Figure 6B:
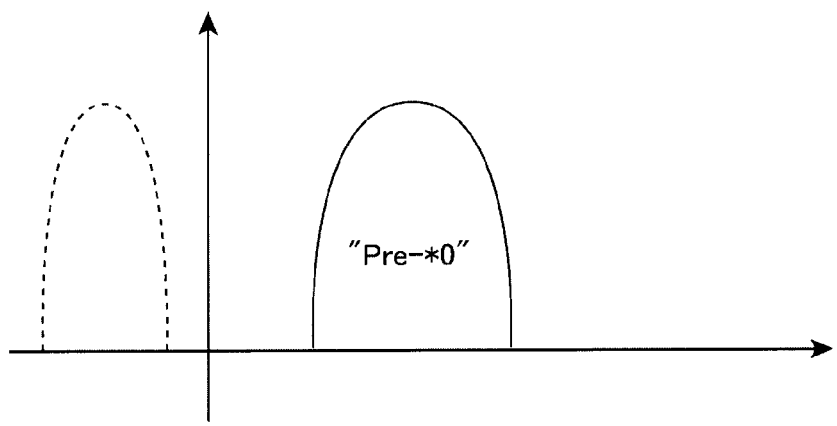
FIG. 6B shows a data programming operation on a memory cell in the NAND type flash memory according to Embodiment 1 of the present invention.
Figure 6C:
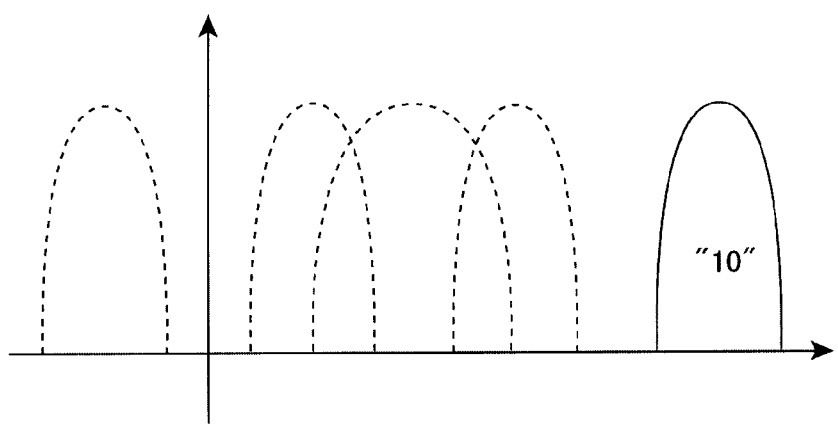
FIG. 6C shows a data programming operation on a memory cell in the NAND type flash memory according to Embodiment 1 of the present invention.

Initially, the threshold distribution in the floating gate is in the "11" state, i.e., the memory cell is in an erasure cell state (FIG. 6A). From this state, "0" data is programmed to the lower page to shift the threshold distribution to a "Pre-*0" state (FIG. 6B). The "Pre-*0" state is a threshold distribution approximately in the middle between the "01" state and the "00" state. Then, "1" data is programmed to the upper page to shift the threshold distribution from the "Pre-*0" state to the "10" state (FIG. 6C).

Owing to such a programming operation, the NAND type flash memory 1 can store 2-bit data on the memory cell, with no need to be fully swung from the "11" state to the "01" state and thus with the shifting width of the threshold distribution being suppressed. The "00" state is realized by programming the "0" data to the upper page from the "Pre-*0" state (see FIG. 5). The "01" state is realized by programming the "0" data to the upper page from the "11" state (see FIG. 5).

In the NAND type flash memory 1, it is preferable that data is programmed to both the upper page and the lower page as described above. However, there are cases where data is programmed only to the lower page and no data is programmed to the upper page. Even in such a case, it is necessary to recognize in which state the memory cell is. In order to realize this, in the NAND type flash memory 1, data is programmed to a bit of a special address which is not visible from the user (hereinafter, such a bit will be referred to as the "LM flag") regarding whether or not data is programmed in the upper page. In the reading operation described below, the LM flag is used.

Now, a reading operation on a memory cell having data programmed therein will be described with reference to FIG. 7. The reading operation on a memory cell is executed by the reading control circuit 51. The reading operation on a memory cell includes a reading operation on a lower page and a reading operation on an upper page. First, the reading operation on a lower page will be described.

For performing the reading operation on a lower page, the reading control circuit 51 selects one memory cell among the plurality of memory cells MC0, MC1, ..., MCn, MCn+1, ..., MCj−1, and reads data from the selecting memory cell at a predetermined reading voltage Aread, which is between the "11" state and the "01" state. Next, the reading control circuit 51 checks the LM flag.

When determining that data is programmed in up to the upper page (that the LM flag is at an "H" level), the reading control circuit 51 reads data at a predetermined reading voltage Bread between the "01" state and the "00" state, and makes a determination on the reading result.

Figure 8:
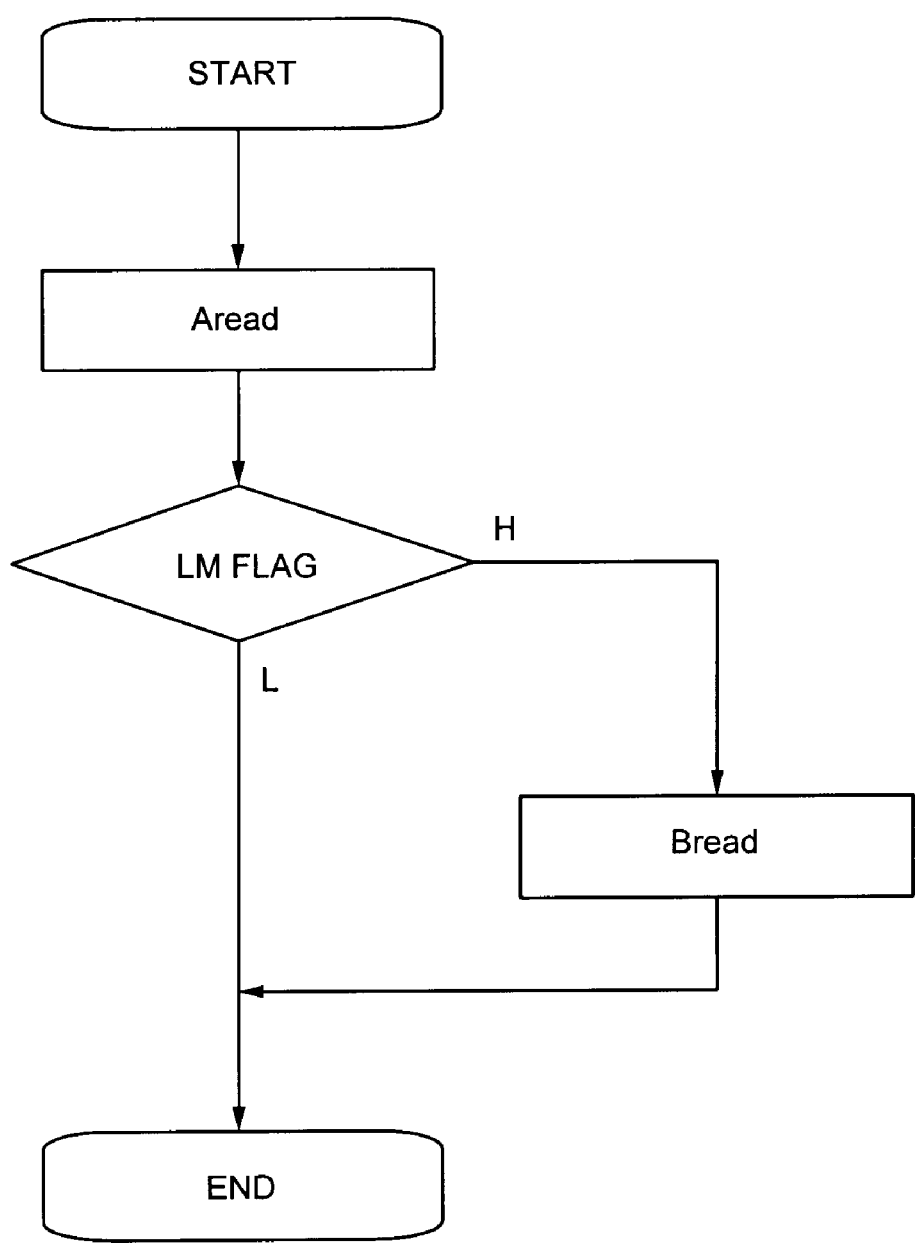
FIG. 8 is a flowchart showing a reading operation on a lower page in the NAND type flash memory according to Embodiment 1 of the present invention.

When determining that data is not programmed in up to the upper page (that the LM flag is at an "L" level), the reading control circuit 51 does not read data at the predetermined reading voltage Bread and only needs to make a determination on the reading result obtained at the reading voltage Aread. FIG. 8 is a flowchart showing the reading operation on the lower page.

Figure 7:
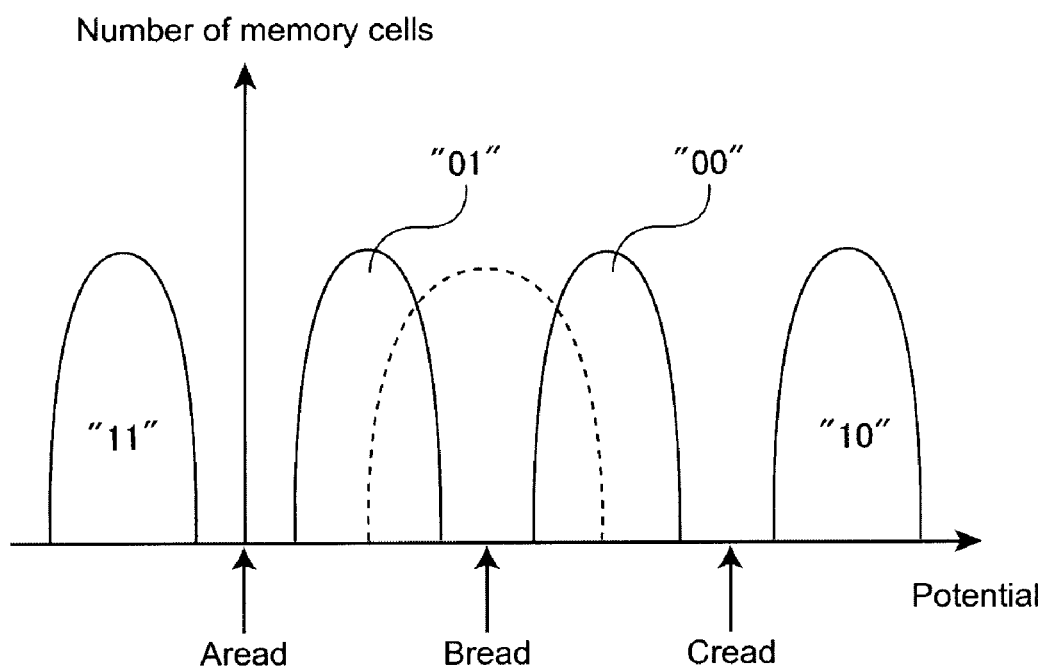
FIG. 7 shows a data reading operation on a memory cell in the NAND type flash memory according to Embodiment 1 of the present invention.

By contrast, for performing the reading operation on an upper page, the reading control circuit 51 selects one memory cell among the plurality of memory cells MC0, MC1, . . . , MCn, MCn+1, . . . , MCj−1, and reads data from the selecting memory cell at a predetermined reading voltage Cread, which is between the "00" state and the "10" state (see FIG. 7). Next, the reading control circuit 51 reads data at the reading voltage Aread, and then checks the LM flag. When determining that data is programmed in the upper page (that the LM flag is at the "H" level), the reading control circuit 51 makes a determination on the reading result obtained at the reading voltage Cread and the reading result obtained at the reading voltage Aread.

Figure 9:
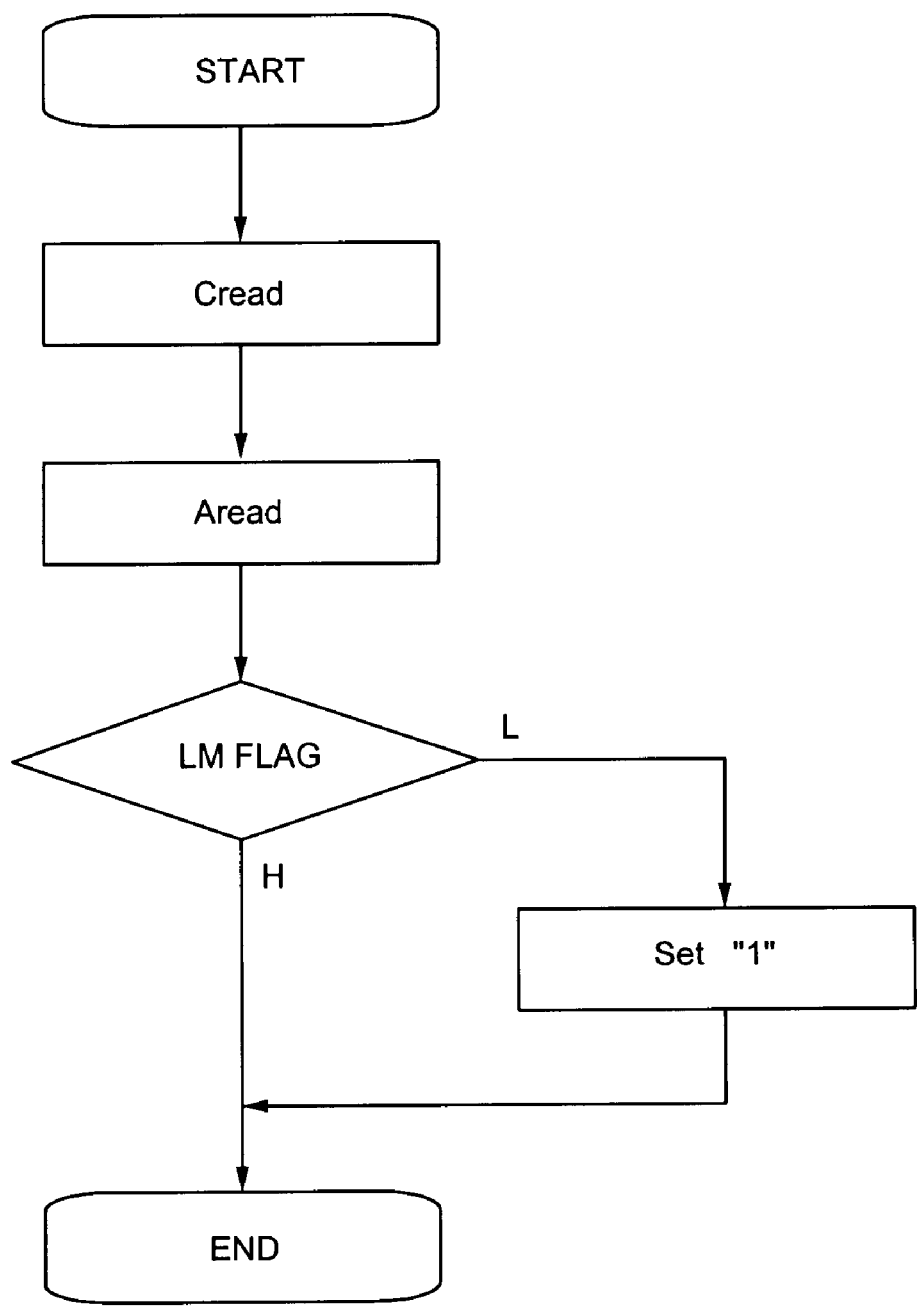
FIG. 9 is a flowchart showing a reading operation on an upper page in the NAND type flash memory according to Embodiment 1 of the present invention.

When data is not programmed in the upper page (when the LM flag is at the "L" level), the threshold distribution is in the "Pre-*0" state and thus is not any of the above-mentioned four states. However, the reading control circuit 51 forcibly sets the upper page to "1" and outputs the result. Owing to such an operation, the reading control circuit 51 can read data from the memory cell. FIG. 9 is a flowchart showing the reading operation on the upper page.

Owing to the following structure and operation, the NAND type flash memory 1 according to Embodiment 1 has a function of suppressing an influence of coupling noise which is generated between floating gates. First, the influence of coupling noise which becomes more conspicuous as the size of the memory is more reduced will be described.

Figure 10:
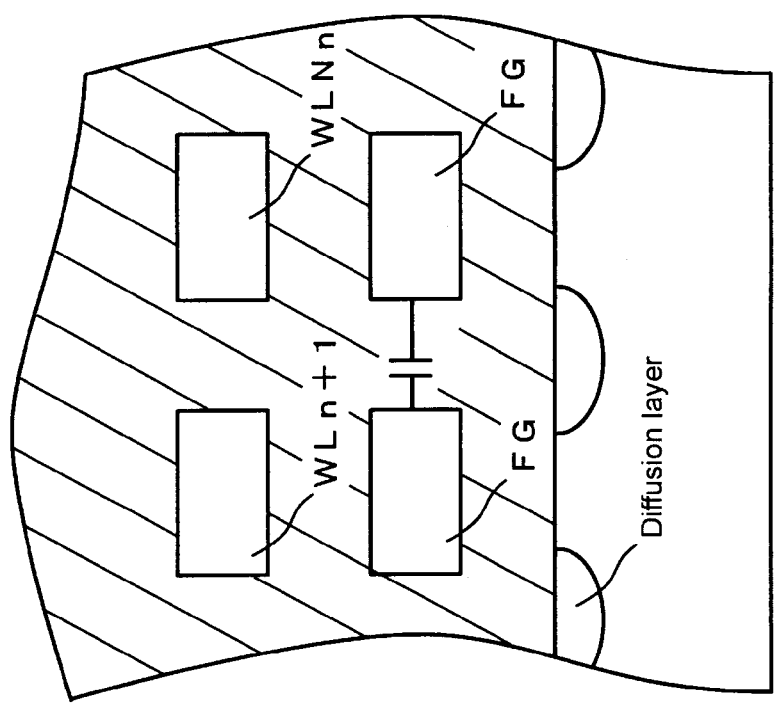
FIG. 10 is a partial cross-sectional view of the NAND type flash memory according to Embodiment 1 of the present invention, which also shows a capacitance generated by coupling.
Figure 1:
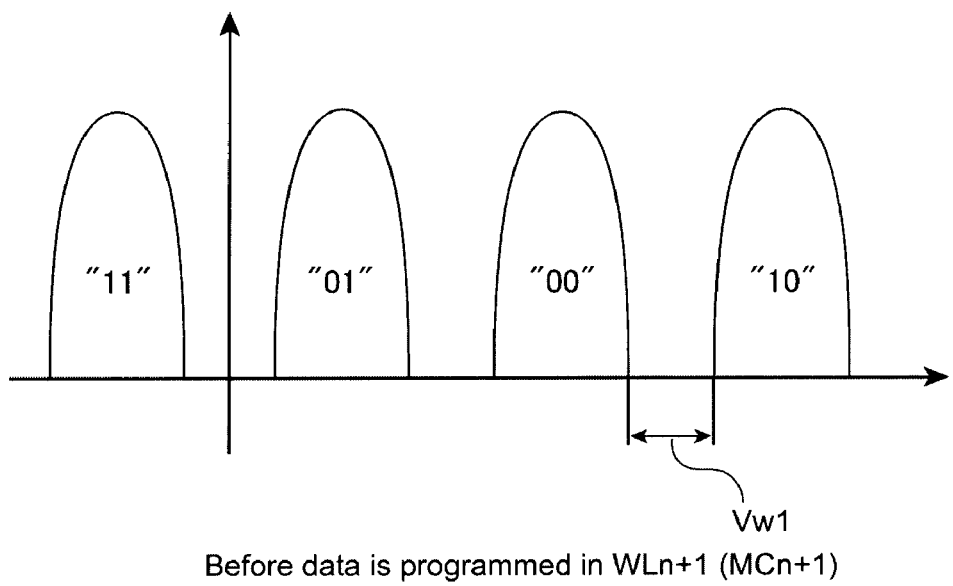
Figure 1:
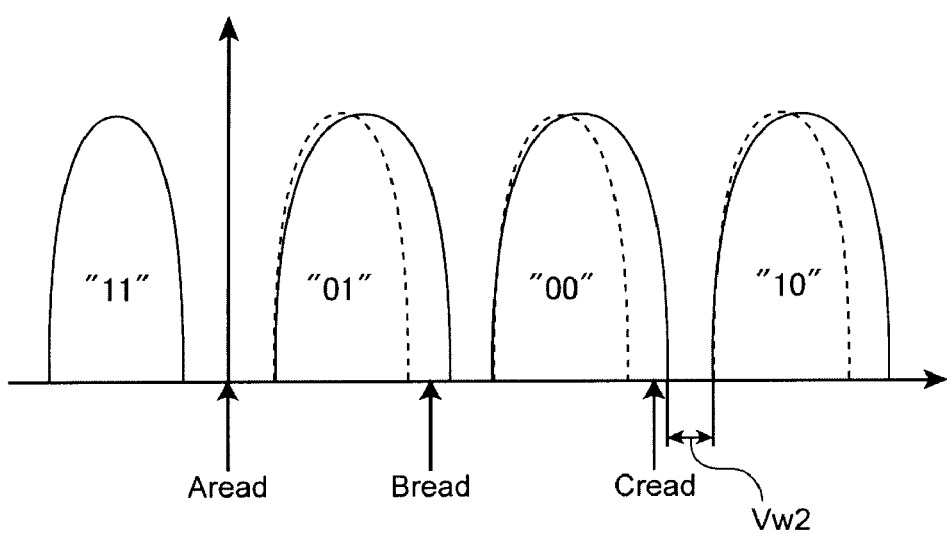

FIG. 10, FIG. 11A and FIG. 11B show how the threshold distribution is changed due to the coupling generated between adjacent floating gates.

FIG. 10 is a partial cross-sectional view of the NAND type flash memory 1 shown in FIG. 4, which also shows a capacitance generated by the coupling. As shown in FIG. 10, data programming made to each of adjacent memory cells causes a potential difference and thus a capacitance is formed between the adjacent floating gates. As the size of a NAND type flash memory is more reduced, the distance between the floating gates becomes shorter. Namely, the capacitance between the floating gates is increased to a level which cannot be ignored. This means that the threshold distribution in each floating gate is influenced.

FIG. 11A and FIG. 11B each show a threshold distribution in the floating gate of one memory cell MCn (memory cell formed in correspondence to a word line WLn). FIG. 11A and FIG. 11B show that data programming made to the memory cell MCn+1 (memory cell formed in correspondence to the word line WLn+1) adjacent to the memory cell MCn shifts the threshold distribution. FIG. 11A shows the threshold distribution in the memory cell MCn before the data is programmed to the adjacent memory cell MCn+1. FIG. 11B shows the threshold distribution in the memory cell MCn after the data is programmed to the adjacent memory cell MCn+1. In FIG. 11B, the dashed line represent the threshold distribution of the corresponding state in FIG. 11A.

As shown in FIG. 11A and FIG. 11B, before data is programmed to the adjacent memory cell MCn+1, the threshold distributions of the four states in the floating gate of the memory cell MCn have a predetermined interval Vw1. After data is programmed to the adjacent memory cell MCn+1, a capacitance is generated between adjacent floating gates, and thus the threshold distribution of each state is broadened. As a result, the interval between the threshold distributions of the four states is narrowed down to Vw2.

As described above, data programming made to the adjacent memory cell MCn+1 narrows the reading margin for the memory cell MCn, which decreases the reliability of the reading operation. Especially when the threshold distributions of the four states are broadened to cover the potentials of the reading voltages Bread and Cread as shown in FIG. 11B, there is an undesirable possibility that adverse affect may be made on the data reading operation.

The NAND type flash memory 1 can correct the reading voltage to guarantee the reliability of the reading operation even when the threshold distribution is changed. Thus, high reliability is provided.

Figure 13:
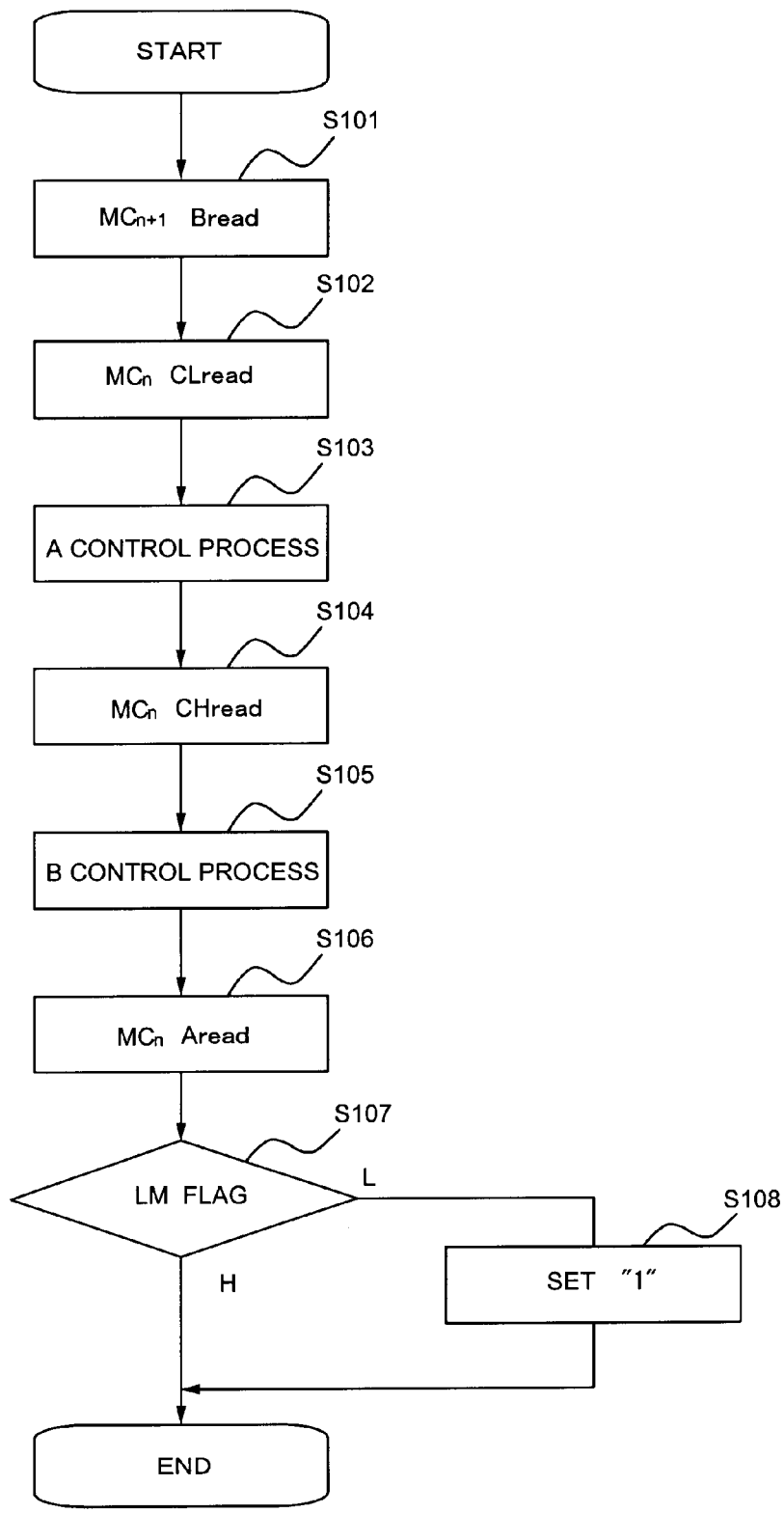
FIG. 13 is a flowchart showing a reading operation on an upper page in the NAND type flash memory according to Embodiment 1 of the present invention.

Now, a reading operation of the NAND type flash memory 1 will be described with reference to FIG. 12 and FIG. 13 which are flowcharts, and FIG. 14A through FIG. 14D which show a change in the threshold distribution. FIG. 12 is a flowchart showing a reading operation on a lower page performed by the NAND type flash memory 1. FIG. 13 is a flowchart showing a reading operation on an upper page performed by the NAND type flash memory 1.

Herein, an exemplary operation for reading data from one selecting memory cell MCn will be described. Hereinafter, the memory cell MCn to be selected here will be referred to as the "selecting memory cell MCn", and the word line corresponding thereto will be referred to as the "selecting word line WLn".

Figure 14A:
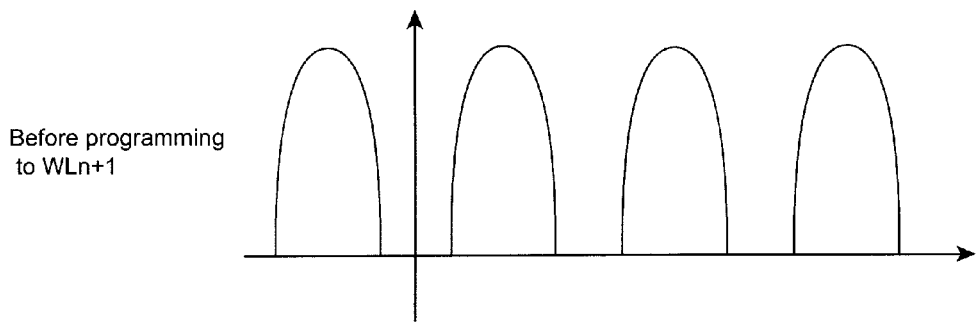
FIG. 14A shows a threshold distribution in a selecting memory cell in the NAND type flash memory according to Embodiment 1 of the present invention, before data is programmed to an adjacent memory cell adjacent to the selecting memory cell.
Figure 14B:
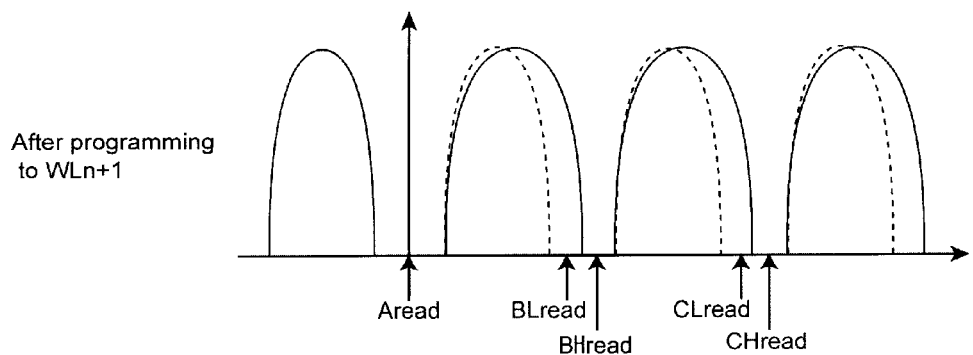
FIG. 14B shows that the threshold distribution in the selecting memory cell in the NAND type flash memory according to Embodiment 1 of the present invention is changed after data is programmed to the adjacent memory cell.

FIG. 14A shows a threshold distribution in the floating gate of the selecting memory cell MCn before data is programmed to the memory cell MCn+1 adjacent to the selecting memory cell MCn (hereinafter, this adjacent memory cell will be referred to as the "adjacent memory cell MCn+1", and the word line corresponding thereto will be referred to as the "adjacent word line WLn+1"). FIG. 14B shows a threshold distribution in the floating gate of the selecting memory cell MCn after data is programmed to the adjacent memory cell MCn+1.

Figure 14C:
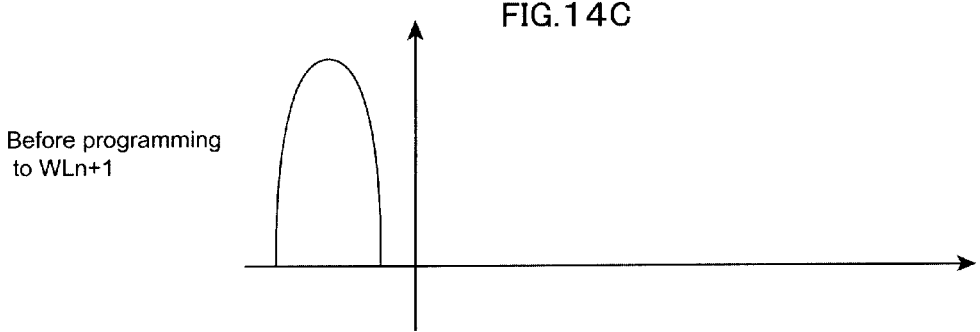
FIG. 14C shows the threshold distribution in the adjacent memory cell in the NAND type flash memory according to Embodiment 1 of the present invention, before data is programmed to the adjacent memory cell.
Figure 14D:
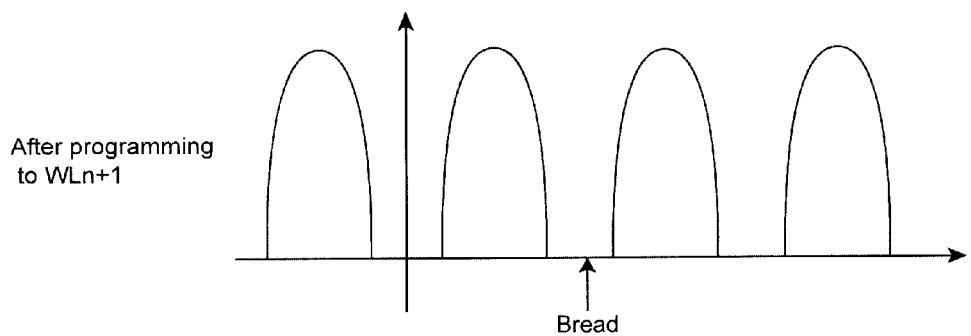
FIG. 14D shows the threshold distribution in the adjacent memory cell in the NAND type flash memory according to Embodiment 1 of the present invention is changed after data is programmed to the adjacent memory cell.

FIG. 14C shows a threshold distribution in the floating gate of the adjacent memory cell MCn+1 before data is programmed to the adjacent memory cell MCn+1 (the threshold distribution is in the "11" state). FIG. 14D shows a threshold distribution in the floating gate of the adjacent memory cell MCn after data is programmed to the adjacent memory cell MCn+1.

First, the reading operation on a lower page will be described. The reading control circuit 51 in the NAND type flash memory 1 reads the threshold distribution in the floating gate of the selecting memory cell MCn at a predetermined reading voltage Aread (FIG. 14B; hereinafter, referred to as the "first reading voltage") (S001 in FIG. 12). Next, the reading control circuit 51 checks the LM flag of the selecting memory cell MCn (S002 in FIG. 12). When the LM flag is at the "L" level, the reading control circuit 51 makes a determination on the value read at the first reading voltage Aread.

By contrast, when the LM flag is at the "H" level, the reading control circuit 51 selects the adjacent memory cell MCn+1 and reads the threshold distribution in the floating gate thereof at a predetermined reading voltage Bread (FIG. 14D, hereinafter, referred to as the "second reading voltage") (S003 in FIG. 12). Then, the reading control circuit 51 again selects the selecting memory cell MCn and reads the threshold distribution in the floating gate thereof at a predetermined reading voltage BLread (FIG. 14B, hereinafter, referred to as the "third reading voltage") (S004 in FIG. 12). Then, the reading control circuit 51 causes the sense amplifier circuit to execute a control process (hereinafter, referred to as the "A control process") (S005 in FIG. 12).

Then, the reading control circuit 51 reads the threshold distribution in the floating gate of the selecting memory cell MCn at a predetermined reading voltage BHread higher than the third reading voltage BLread (FIG. 14B; hereinafter, the reading voltage BHread will be referred to as the "fourth reading voltage") (S006 in FIG. 12). The fourth reading voltage BHread corresponds to a first reading voltage verify level. The reading control circuit 51 causes the sense amplifier circuit to execute a control process on the reading result (hereinafter, referred to as the "B control process") (S007 in FIG. 12), and reads the result. Thus, the reading operation on the lower page can be performed.

Next, the reading operation on an upper page will be described. The reading control circuit 51 selects the adjacent memory cell MCn+1 and reads the threshold distribution in the floating gate thereof at the second reading voltage Bread (FIG. 14D) (S101 in FIG. 13). Then, the reading control circuit 51 selects the selecting memory cell MCn and reads the threshold distribution in the floating gate thereof at a predetermined reading voltage CLread (FIG. 14B, hereinafter, referred to as the "fifth reading voltage") (S102 in FIG. 13). Then, the reading control circuit 51 causes the sense amplifier circuit to execute a control process (the A control process) (S103 in FIG. 13).

Then, the reading control circuit 51 reads the threshold distribution in the floating gate of the selecting memory cell MCn at a predetermined reading voltage CHread higher than the fifth reading voltage CLread (FIG. 14B; hereinafter, the reading voltage CHread will be referred to as the "sixth reading voltage") (S104 in FIG. 13). The sixth reading voltage CHread corresponds to a second reading voltage verify level. The reading control circuit 51 causes the sense amplifier circuit to execute a control process on the reading result (the B control process) (S105 in FIG. 13).

The reading control circuit 51 again selects the selecting memory cell MCn and reads the threshold distribution in the floating gate thereof at the first reading voltage Aread (S106 in FIG. 13) and checks the LM flag (S107 in FIG. 13). When the LM flag is at the "H" level, the reading control circuit 51 reads the result; whereas when the LM flag is at the "L" level, the reading control circuit 51 executes a process of forcibly setting the upper page to "1" (S108 in FIG. 13). Thus, the reading operation on the upper page can be performed.

As described above, when reading data from a selecting memory cell, the NAND type flash memory 1 reads data from a memory cell adjacent thereto and thus corrects the reading voltage for the selecting memory cell. Namely, the reading voltages of the first and second verify levels can be defined. Owing to this, the NAND type flash memory 1 can suppress the influence by the coupling noise and thus provide high reliability.

The fourth reading voltage BHread is set to be higher than the third reading voltage BLread, and the sixth reading voltage CHread is set to be higher than the fifth reading voltage CLread. Such settings are provided such that even when the threshold distribution in the floating gate of the selecting memory cell MCn is shifted from the distribution represented with the dashed line to the distribution represented with the solid line as shown in FIG. 14B in the case where data is programmed in the adjacent memory cell MCn+1, the influence of such a shift can be avoided. The degree of the shift of the threshold distribution in the floating gate of the selecting memory cell MCn depends on a designing element of the NAND type flash memory 1, for example, the distance between adjacent floating gates or the like.

Figure 15:
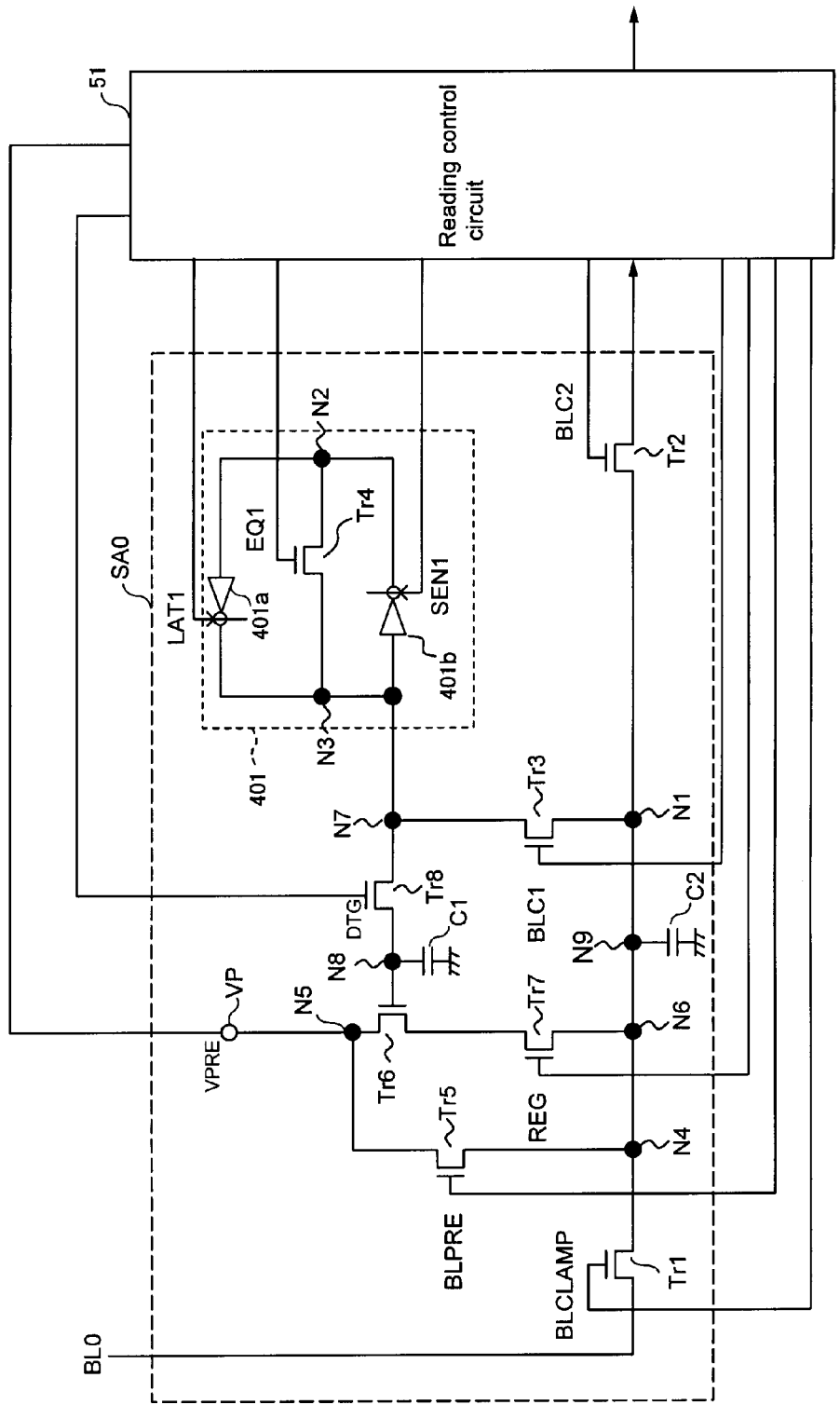
FIG. 15 shows an equivalent circuit configuration of a sense amplifier circuit in a reading and programming circuit section in the NAND type flash memory according to Embodiment 1 of the present invention.

Now, further details of the structure and operation of the NAND type flash memory 1 for realizing the above-described reading operations on the lower page and the upper page will be described. FIG. 15 shows an exemplary equivalent circuit configuration of a sense amplifier circuit (for example, SA0) in the reading and programming circuit section 4 according to Embodiment 1.

The sense amplifier circuit SA0 shown in FIG. 15 includes a first NMOS transistor (hereinafter, referred to as the "first transistor") Tr1 and a second NMOS transistor (hereinafter, referred to as the "second transistor") Tr2. Source/drain regions of the first transistor Tr1 and the second transistor Tr2 are connected in series between the reading control circuit 51 and the bit line BL0. The first transistor Tr1 is controlled to be on or off by a control signal BLCLAMP. The second transistor Tr2 is controlled to be on or off by a control signal BLC2.

A node N1, which is a connection point between the first transistor Tr1 and the second transistor Tr2, is connected to a latch circuit 401 via a third NMOS transistor (hereinafter, referred to as the "third transistor") Tr3. The third transistor Tr3 is controlled to be on or off by a control signal BLC1. The latch circuit 401 includes two clocked inverters 401a and 401b connected anti-parallel to each other. Between nodes N2 and N3, which are connection points between the two clocked inverters 401a and 401b, a fourth NMOS transistor (hereinafter, referred to as the "fourth transistor") Tr4 is provided. The fourth transistor Tr4 is controlled to be on or off by a control signal EQ1.

A node N4 is a connection point which is between the first transistor Tr1 and the second transistor Tr2 in the sense amplifier circuit SA0 and is closer to the first transistor Tr1 than the node N1. The node N4 is connected to a voltage terminal VP via a fifth NMOS transistor (hereinafter, referred to as the "fifth transistor") Tr5. The voltage terminal VP is provided for applying a precharge voltage VPRE. The fifth transistor Tr5 is controlled to be on or off by a control signal BLPRE.

The sense amplifier circuit SA0 also includes a sixth NMOS transistor (hereinafter, referred to as the "sixth transistor") Tr6 and a seventh NMOS transistor (hereinafter, referred to as the "seventh transistor") Tr7. Source/drain regions of the sixth transistor Tr6 and the seventh transistor Tr7 are connected in series between a node N5 and a node N6. The node N5 is between the fifth transistor Tr5 and the voltage terminal VP for applying the precharge voltage VPRE, and the node N6 is between the nodes N1 and N4. The sixth transistor Tr6 is closer to the node 5 than the seventh transistor Tr7. The seventh transistor Tr7 is controlled to be on or off by a control signal REG.

The sense amplifier circuit SA0 further includes an eighth NMOS transistor (hereinafter, referred to as the "eighth transistor") Tr8. The eighth transistor Tr8 is connected between a gate of the sixth transistor Tr6 and a node N7, which is between the latch circuit 401 and the third transistor Tr3. The eighth transistor Tr8 is controlled to be on or off by a control signal DTG. A capacitor C1 for retaining the potential is connected to a node N8 between the eighth transistor Tr8 and the sixth transistor Tr6. A capacitor C2 for retaining the potential is connected to a node N9 between the node N1 and the node N6.

Gate terminals of the first through eighth transistors Tr1 through Tr8 are connected to an output terminal of the reading control circuit 51. The reading control circuit 51 controls the first through eighth transistors Tr1 through Tr8 by supplying the control signals BLCLAMP, BLC2, BLC1, EQ1, BLPRE, REG and DTG to the gate terminals thereof.

Drain terminals of the fifth and sixth transistors Tr5 and Tr6 are connected to the output terminal of the reading control circuit 51. The reading control circuit 51 supplies the precharge voltage VPRE to the drain terminals of the fifth and sixth transistors Tr5 and Tr6. Control terminals of the clocked inverters 401a and 401b are connected to the output terminal of the reading control circuit 51. The reading control circuit 51 supplies control signals LAT1 and SEN1 respectively to the control terminals of the clocked inverters 401a and 401b.

With the above-described structure, the NAND type flash memory 1 can cause the data programmed in the memory cells MC0, MC1, . . . , MCn, MCn+1, . . . , MCj−1 to be retained in the sense amplifier circuits SA0, SA1, . . . . SAi−1. The NAND type flash memory 1 can also cause the sense amplifier circuits SA0, SA1, . . . , SAi−1 to execute the A control process and the B control process during the reading operations. The structure of the sense amplifier circuits SA0, SA1, . . . , SAi−1 is especially advantageous in being designed very easily for correcting the data reading voltage.

Now, a specific process using the sense amplifier circuits SA0, SA1, . . . , SAi−1 will be described. First, a process executed by the NAND type flash memory 1 for performing the reading operation on a lower page as described above with reference to FIG. 12 will be described.

The reading control circuit 51 reads the threshold distribution in the floating gate of the selecting memory cell MCn at the first reading voltage Aread (S001 in FIG. 12). Next, the reading control circuit 51 checks the LM flag of the selecting memory cell MCn (S002 in FIG. 12). When the LM flag is at the "L" level, the reading control circuit 51 reads the reading result obtained with the first reading voltage Aread as it is.

Next, a specific exemplary operation of the reading control circuit 51 and the sense amplifier circuits SA0, SA1, . . . , SAi−1 for carrying out steps S001 and S002 in FIG. 12 will be described.

The reading control circuit 51 puts the control signals BLPRE, BLCLAMP and VPRE to the "H" level to place the fifth and first transistors Tr5 and Tr1 into an ON state, and thus charges the bit line BL0 with the precharge voltage VPRE. Then, the reading control circuit 51 puts the control signals BLPRE and BLCLAMP to the "L" level to place the fifth and first transistors Tr5 and Tr1 to an OFF state, and thus discharges the precharge voltage VPRE from the bit line BL0.

Then, the reading control circuit 51 selects the selecting memory cell MCn, and while keeping the control signal BLPRE at the "L" level, puts the control signal BLCLAMP to the "H" level. Thus, the reading control circuit 51, while keeping the fifth transistor Tr5 in the OFF state, places the first transistor Tr1 into the ON state. Owing to this operation, the reading control circuit 51 reads the threshold distribution in the floating gate of the selecting memory cell MCn at the first reading voltage Aread, and causes the reading result to be retained in the capacitor C2.

The reading control circuit 51 checks the LM flag of the selecting memory cell MCn (S002 in FIG. 12). When the LM flag is at the "L" level, the reading control circuit 51 puts the control signal BLC2 to be supplied to the gate of the second transistor Tr2 to the "H" level to place the second transistor Tr2 into the ON state, and reads the data retained in the capacitor C2.

By contrast, when determining that the LM flag is at the "H" level, the reading control circuit 51 selects the adjacent memory cell MCn+1 and reads the threshold distribution in the floating gate thereof at the second reading voltage Bread. The reading result is retained in the latch circuit 401 in the sense amplifier circuit SA0 (S003 in FIG. 12).

The reading control circuit 51 selects the selecting memory cell MCn and reads the threshold distribution in the floating gate thereof at the third reading voltage BLread. The reading result is retained in the capacitor C2 connected to the node N9 (S004 in FIG. 12).

The sense amplifier circuit SA0 executes the A control process based on the value retained in the capacitor C2 and retains the result in the latch circuit 401 (S005 in FIG. 12).

The reading control circuit 51 selects the selecting memory cell MCn and reads the threshold distribution in the floating gate thereof at the fourth reading voltage BHread. The reading result is retained in the capacitor C2 connected to the node N9 (S006 in FIG. 12).

The sense amplifier circuits SA0, SA1, . . . , SAi−1 execute the B control process based on the data (capacitance) retained in the capacitor C2 and retains the result in the latch circuit 401 (S007 in FIG. 12).

Before the A control process shown in FIG. 12 is executed, the reading control circuit 51 reads the threshold distribution in the floating gate of the selecting memory cell MCn at the third reading voltage BLread and causes the capacitor C2 to retain the reading result. The reading control circuit 51 also reads the threshold distribution in the floating gate of the adjacent memory cell MCn+1 at the second reading voltage Bread and causes the latch circuit 401 to retain the reading result.

Next, a specific exemplary operation of the reading control circuit 51 for carrying out steps S003 and S004 in FIG. 12 before the execution of the A control process will be described.

The reading control circuit 51 puts the control signals BLPRE, BLCLAMP and VPRE to the "H" level to place the fifth and first transistors Tr5 and Tr1 into the ON state, and thus charges the bit line BL0 with the precharge voltage VPRE. Then, the reading control circuit 51 puts the control signals BLPRE and BLCLAMP to the "L" level to place the fifth and first transistors Tr5 and Tr1 into the OFF state, and thus discharges the precharge voltage VPRE from the bit line BL0.

Then, the reading control circuit 51 selects the adjacent memory cell MCn+1, and while keeping the control signal BLCLAMP at the "H" level, puts the control signal BLPRE to the "L" level. Thus, the reading control circuit 51, while keeping the first transistor Tr1 in the ON state, places the fifth transistor Tr5 into the OFF state. Owing to this operation, the reading control circuit 51 reads the threshold distribution in the floating gate of the adjacent memory cell MCn+1 at the second reading voltage Bread, and causes the reading result to be retained in the capacitor C2.

The reading control circuit 51 puts the control signal BLC1 to the "H" level to place the third transistor Tr3 into the ON state, and thus connects the node N7 and N1. Also, the reading control circuit 51 puts the control signals LAT1 and SEN1 to the "H" level to cause the data (potential) retained in the capacitor C2 to be retained in the latch circuit 401.

The reading control circuit 51 puts the control signals BLPRE, BLCLAMP and VPRE to the "H" level to place the fifth and first transistors Tr5 and Tr1 into the ON state, and thus charges the bit line BL0 with the precharge voltage VPRE. Then, the reading control circuit 51 puts the control signals BLPRE and BLCLAMP to the "L" level to place the fifth and first transistors Tr5 and Tr1 into the OFF state, and thus discharges the precharge voltage VPRE from the bit line BL0.

The reading control circuit 51 selects the selecting memory cell MCn, and while keeping the control signal BLPRE at the "H" level, puts the control signal BLCLAMP to the "L" level. Thus, the reading control circuit 51, while keeping the first transistor Tr5 in the ON state, places the fifth transistor Tr1 into the OFF state. Owing to this operation, the reading control circuit 51 reads the threshold distribution in the floating gate of the selecting memory cell MCn at the third reading voltage BLread and causes the reading result to be retained the capacitor C2.

Figure 16:
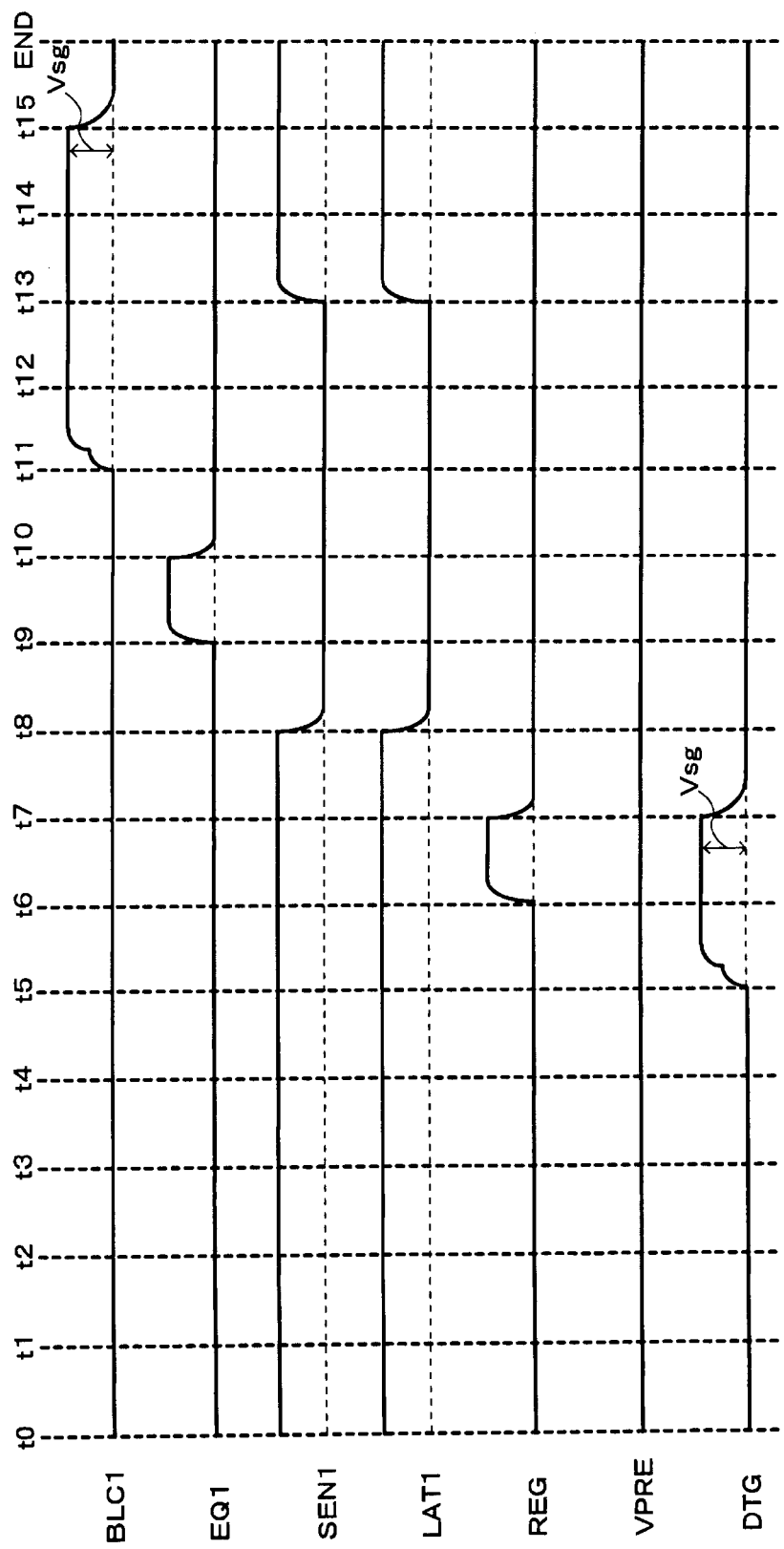
FIG. 16 is a timing diagram showing an A control process executed in the NAND type flash memory according to Embodiment 1 of the present invention.
Figure 17:
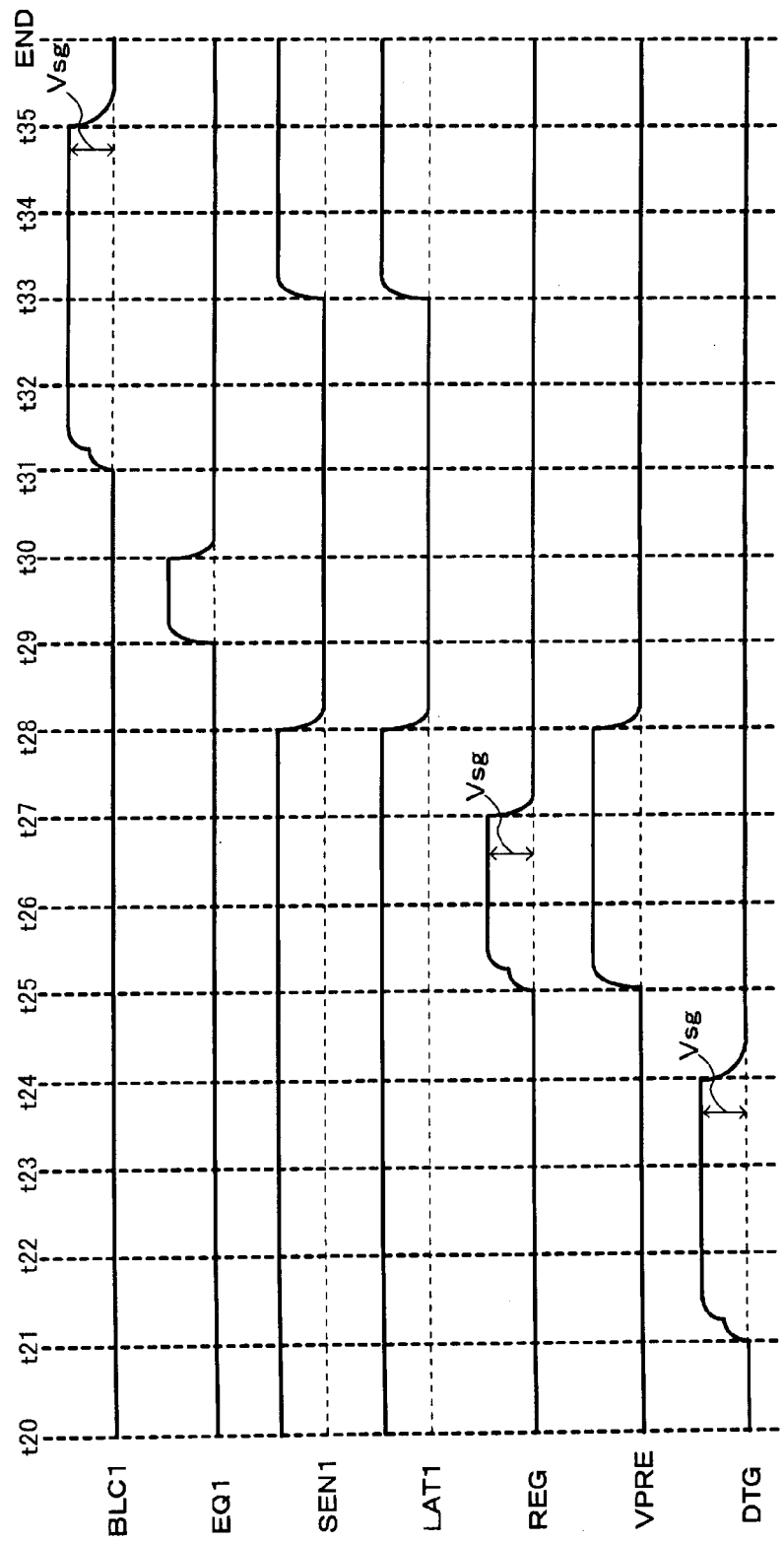
FIG. 17 is a timing diagram showing a B control process executed in the NAND type flash memory according to Embodiment 1 of the present invention.

The A control process and the B control process explained above will be described in more detail with reference to FIG. 16 and FIG. 17. FIG. 16 is a timing diagram of the signals in the A control process. FIG. 17 is a timing diagram of the signals and the precharge voltage VPRE in the B control process.

First, the A control process will be described. At time t=t0, the capacitor C2 retains the threshold distribution in the floating gate of the selecting memory cell MCn read by the reading control circuit 51 at the third reading voltage BLread. At time t=t0 also, the latch circuit 401 retains the threshold distribution in the floating gate of the adjacent memory cell MCn+1 read by the reading control circuit 51 at the second reading voltage Bread. At time t0, the reading control circuit 51 places the first through eighth transistors Tr1 through Tr8 into the OFF state.

At time t=t5, the reading control circuit 51 puts the control signal DTG to the "H" level. As a result, the eighth transistor Tr8 is placed into the ON state, and thus the data retained in the latch circuit 401 is programmed to the capacitor C1 connected to the node N8.

At time t=t6, the reading control circuit 51 keeps the control signal DTG at the "H" level; and at time t=t7, the reading control circuit 51 puts the control signal DTG to the "L" level. The node N8 is connected to the gate of the sixth transistor Tr6. Therefore, when the data (capacitance) retained in the capacitor C1 is at the "H" level, the sixth transistor Tr6 is placed into the ON state; whereas when the data (capacitance) retained in the capacitor C1 is at the "L" level, the sixth transistor Tr6 is placed into the OFF state.

At time t=t6, the reading control circuit 51 puts the control signal REG to the "H" level to place the seventh transistor Tr7 into the ON state. As a result, when the data (capacitance) retained in the capacitor C1 is at the "H" level, both the sixth transistor Tr6 and the seventh transistor Tr7 are placed into the ON state. Thus, the node N9 and the voltage terminal VP for providing the precharge voltage VPRE are connected to each other, and a potential equal to the precharge voltage VPRE is retained in the capacitor C2. At time t=t6, the reading control circuit 51 puts the precharge voltage to the "L" level. By contrast, when the data (capacitance) retained in the capacitor C1 is at the "L" level, the node N9 and the voltage terminal VP for providing the precharge voltage VPRE are not connected to each other. As a result, the capacitor C2 keeps the same potential.

At time t=t8, the reading control circuit 51 puts both the controls signals SEN1 and LAT1 respectively for the two clocked inverters 401a and 401b to the "L" level. At time t=t9, the reading control circuit 51 puts the control signal EQ1 for the fourth transistor Tr4 in the latch circuit 401 to the "H" level. As a result, the data retained in the latch circuit 401 is cleared.

At time t=t11 to t14, the reading control circuit 51 puts the control signal BLC1 to the "H" level to place the third transistor Tr3 into the ON state. Thus, the node 7 and the node N1 are connected to each other, and the data (potential) retained in the capacitor C2 is retained in the latch circuit 401.

Owing to the above-described operation, the NAND type flash memory 1 can realize the A control process. The above-described result mean that the result varies depending on the data retained in the latch circuit 401 at time t=tO. For example, when the data of the "L" level is retained in advance in the latch circuit 401, the data (capacitance) retained in the capacitor C2 in advance is retained in the latch circuit 401.

When the data of the "H" level is retained in advance in the latch circuit 401, the precharge voltage VPRE is retained in the latch circuit 401.

More specifically, when the reading result of the adjacent memory cell MCn+1 obtained at the second reading voltage Bread is the "L" level, the reading result obtained at the third reading voltage BLread is retained in the latch circuit 401. When the reading result of the adjacent memory cell MCn+1 obtained at the second reading voltage Bread is the "H" level, the precharge voltage VPRE ("L" level) is retained in the latch circuit 401.

In the sense amplifier circuit SA0 shown in FIG. 15, the nodes N8 and N9 are connected to the capacitors C1 and C2 additionally provided. Where the circuit configuration can maintain a certain voltage for a predetermined time period, it is not necessary to additionally provide capacitors and a so-called line capacitance is usable.

Next, the B control process will be described with reference to FIG. 17. At time t=t20, the capacitor C2 retains the threshold distribution in the floating gate of the selecting memory cell MCn read by the reading control circuit 51 at the third reading voltage BLread. At time t=t20 also, the latch circuit 401 retains the result of the A control process. At time t20, the reading control circuit 51 places the first through eighth transistors Tr1 through Tr8 into the OFF state.

At time t=t21, the reading control circuit 51 puts the control signal DTG to the "H" level. As a result, the eighth transistor Tr8 is placed into the ON state, and thus the data retained in the latch circuit 401 (result of the A control process) is programmed to the capacitor C1 connected to the node N8.

At time t=t21 to t23, the reading control circuit 51 keeps the control signal DTG at the "H" level; and at time t=t24, the reading control circuit 51 puts the control signal DTG to the "L" level. The node N8 is connected to the gate of the sixth transistor Tr6. Therefore, when the data (capacitance) retained in the capacitor C1 is at the "H" level, the sixth transistor Tr6 is placed into the ON state; whereas when the data (capacitance) retained in the capacitor C1 is at the "L" level, the sixth transistor Tr6 is placed into the OFF state.

At time t=t25, the reading control circuit 51 puts the control signal REG to the "H" level. As a result, the seventh transistor Tr7 is placed into the ON state. As a result, when the data (potential) retained in the capacitor C1 is at the "H" level, both the sixth transistor Tr6 and the seventh transistor Tr7 are placed into the ON state. Thus, the node N9 and the voltage terminal VP for providing the precharge voltage VPRE are connected to each other, and a potential equal to the precharge voltage VPRE is retained in the capacitor C2. At time t=t25 to t27, the reading control circuit 51 puts the precharge voltage to the "H" level. By contrast, when the data (potential) retained in the capacitor C1 is at the "L" level, the node N9 and the voltage terminal VP for providing the precharge voltage VPRE are not connected to each other. As a result, the capacitor C2 keeps the same potential.

At time t=t28, the reading control circuit 51 puts both the controls signals SEN1 and LAT1 respectively for the two clocked inverters 401a and 401b to the "L" level. At time t=t29, the reading control circuit 51 puts the control signal EQ1 for the fourth transistor Tr4 in the latch circuit 401 to the "H" level. As a result, the data retained in the latch circuit 401 is cleared.

At time t=t31 to t34, the reading control circuit 51 puts the control signal BLC1 to the "H" level to place the third transistor Tr3 into the ON state. Thus, the node 7 and the node N1 are connected to each other, and the data (potential) retained in the capacitor C2 is retained in the latch circuit 401.

Owing to the above-described operation, the NAND type flash memory 1 can realize the B control process. The above-described result also mean that the result varies depending on the data retained in the latch circuit 401 in advance, like in the A control process.

For example, when the data of the "L" level is retained in advance in the latch circuit 401, the data (capacitance) retained in the capacitor C2 in advance is retained in the latch circuit 401. When the data of the "H" level is retained in advance in the latch circuit 401, the precharge voltage VPRE ("H" level) is retained in the latch circuit 401.

More specifically, when the result of the A control process is the "L" level, the reading result obtained at the fourth reading voltage BHread is retained in the latch circuit 401. When the result of the A control process is the "H" level, the precharge voltage VPRE ("H" level) is retained in the latch circuit 401. FIG. 18 shows combinations of levels in the flowchart shown in FIG. 12. When the result of the B control process shown in FIG. 18 is the "H" level, the reading control circuit 51 determines that the value of the lower page is "0"; whereas when the result of the B control process shown in FIG. 18 is the "L" level, the reading control circuit 51 determines that the value of the lower page is "1".

Regarding FIG. 18, the third reading voltage BLread is lower than the fourth reading voltage BHread. Therefore, when the threshold distribution in the selecting memory cell MCn read at the third reading voltage BLread is determined to be at the "L" level, the threshold distribution is never determined to be at the "H" level even when read at the fourth reading voltage BHread (represented with "−" in FIG. 18). Therefore, with the NAND type flash memory 1, where data is programmed in the adjacent memory cell MCn+1, the result which is read at the fourth reading voltage BHread can be adopted in order to suppress the coupling noise. As a result, the reading operation of the 4-value data becomes more reliable, and the NAND type flash memory 1 can provide higher reliability.

The reading operation on an upper page will be described.

In this case also, substantially the same process as described above is executed for each of the A control process and the B control process. Namely, in the reading operation on an upper page, the result of the A control process mean that the result varies depending on the data retained in the latch circuit 401 at time t=t20.

For example, when the data of the "L" level is retained in advance in the latch circuit 401, the data (capacitance) retained in the capacitor C2 in advance is retained in the latch circuit 401. When the data of the "H" level is retained in advance in the latch circuit 401, the precharge voltage VPRE is retained in the latch circuit 401.

More specifically, when the reading result of the selecting memory cell MCn obtained at the second reading voltage Bread is the "L" level, the reading result obtained at the fifth reading voltage CLread is retained in the latch circuit 401. When the reading result of the selecting memory cell MCn obtained at the second reading voltage Bread is the "H" level, the precharge voltage VPRE ("L" level) is retained in the latch circuit 401.

The result of the B control process also means that the result varies depending on the data retained in the latch circuit 401 in advance.

For example, when the data of the "L" level is retained in advance in the latch circuit 401, the data (capacitance) retained in the capacitor C2 in advance is retained in the latch circuit 401. When the data of the "H" level is retained in advance in the latch circuit 401, the precharge voltage VPRE ("H" level) is retained in the latch circuit 401.

More specifically, when the result of the A control process is the "L" level, the reading result obtained at the sixth reading voltage CHread is retained in the latch circuit 401. When the result of the A control process is the "H" level, the precharge voltage VPRE ("H" level) is retained in the latch circuit 401. FIG. 19 shows combinations of levels in the flowchart shown in FIG. 13. When the result of the B control process shown in FIG. 19 is the "H" level, the reading control circuit 51 determines that the value of the upper page is "0"; whereas when the result of the B control process shown in FIG. 19 is the "L" level, the reading control circuit 51 determines that the value of the upper page is "1".

As described above, with the NAND type flash memory 1, where data is programmed in the adjacent memory cell MCn+1, the results which are read at the fourth reading voltage BHread and the sixth reading voltage CHread can be adopted in order to suppress the coupling noise. As a result, the NAND type flash memory 1 can provide higher reliability.

In Embodiment 1, the second reading voltage (Bread) is used for determining whether or not data is programmed in the adjacent memory cell MCn+1, but the reading voltage is not limited to the second reading voltage (Bread). Any reading voltage at which it can be determined whether or not data is programmed in the adjacent memory cell MCn+1 is usable. The reading voltage may be lower or higher than the second reading voltage Bread as long as being higher than the first reading voltage Aread.

Embodiment 2

Figure 20:
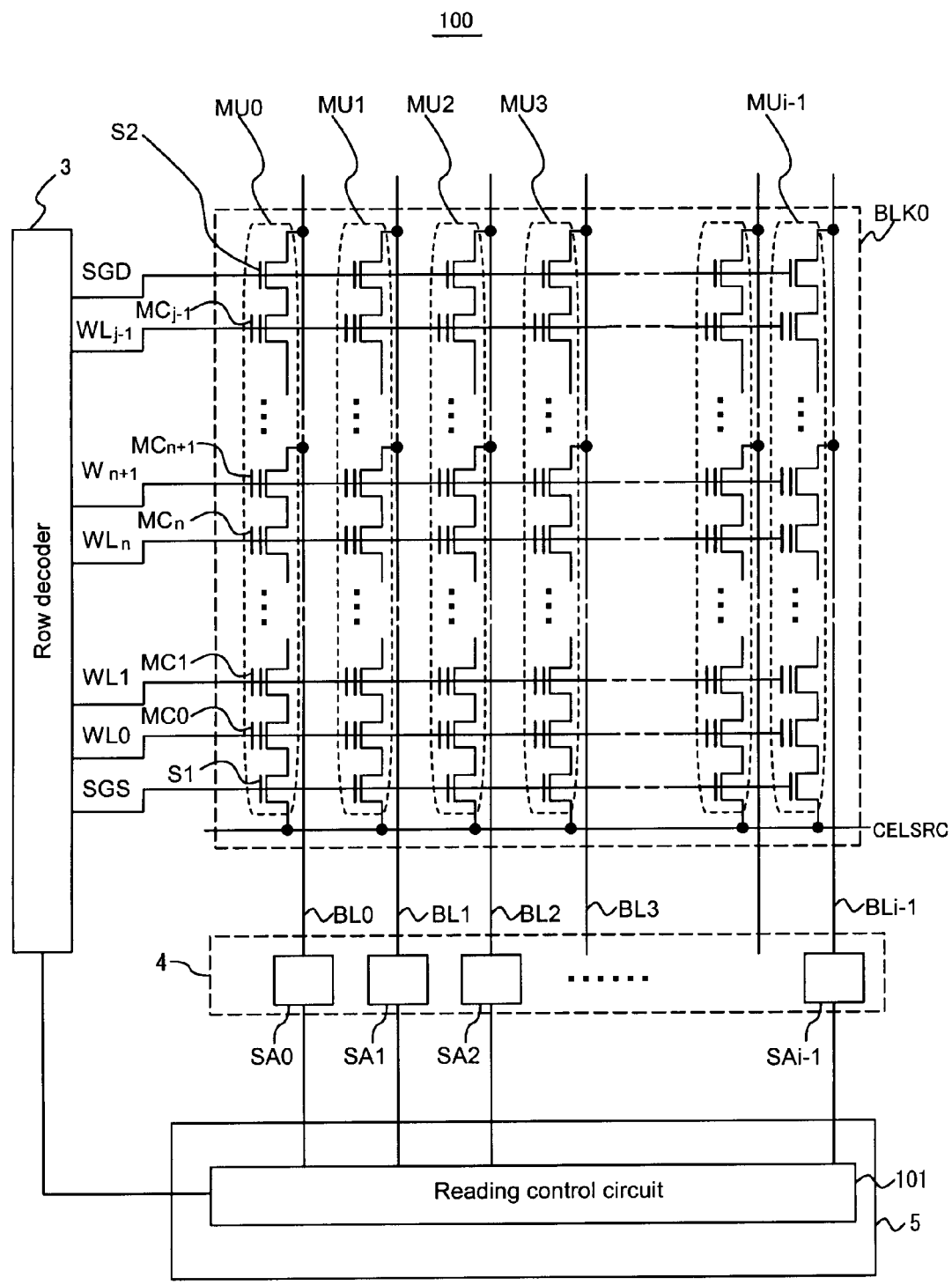
FIG. 20 is a schematic block diagram showing a memory cell block in a NAND type flash memory according to Embodiment 2 of the present invention.

Next, Embodiment 2 of the present invention will be described with reference to the drawings. FIG. 20 is a block diagram showing an exemplary detailed structure of one of a plurality of memory cell blocks BLK0, BLK1, BLKm−1 (for example, BLK0) in a NAND type flash memory 100 according to Embodiment 2 of the present invention. In Embodiment 2, elements having the same or similar functions as those in Embodiment 1 bear the same reference numerals therewith, and detailed descriptions thereof will be omitted.

As shown in FIG. 20, the NAND type flash memory 100 according to Embodiment 2 of the present invention includes a reading control circuit 101 instead of the reading control circuit 51 included in the NAND type flash memory 1 according to Embodiment 1 of the present invention.

The reading and programming circuit section 4 includes a plurality of (i pieces of) sense amplifier circuits SA0, SA1, . . . , SAi−1. The peripheral circuit section 5 includes the reading control circuit 101. The reading control circuit 101 is connected to the plurality of (i pieces of) sense amplifier circuits SA0, SA1, . . . , SAi−1 and the row decoder 3. The reading control circuit 101 controls the plurality of (i pieces of) sense amplifier circuits SA0, SA1, . . . , SAi−1 and the row decoder 3 to read data from each of the memory cells MC0, MC1, . . . , MCn, MCn+1, . . . , MCj−1.

The reading and programming control circuit section 4 and the reading control section 101 form a data reading and programming control section for, when performing 4-value data programming, read and erasure with respect to the plurality of memory cells MC0, MC1, . . . , MCn, MCn+1, . . . , MCj−1, selecting and applying a voltage to a corresponding word line and a corresponding bit line among the plurality of word lines WL0, WL1, . . . , WLn, WLn+1, . . . , WLj−1 and the plurality of bit lines BL0, BL1, . . . , BLi−1.

Figure 21:
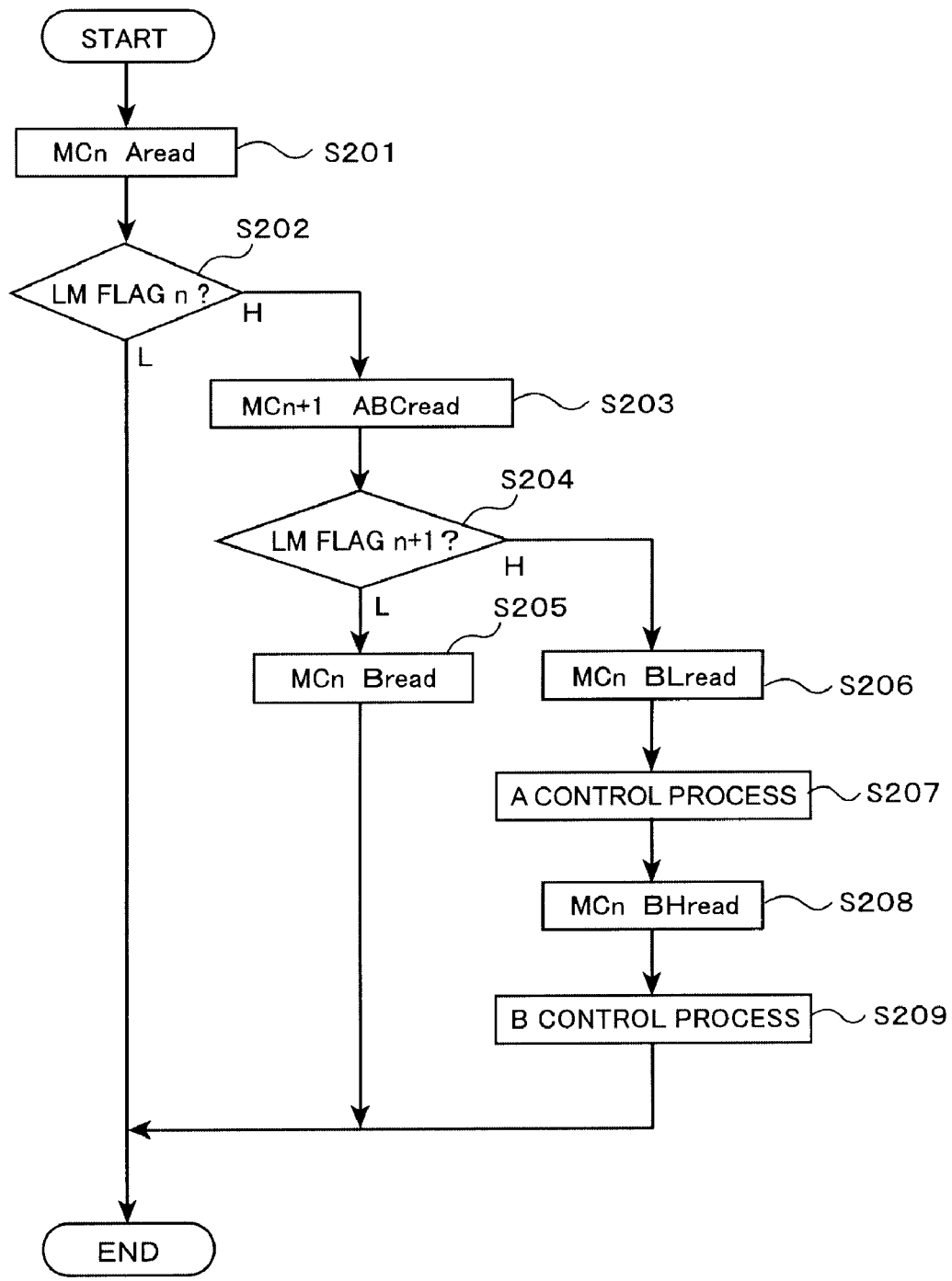
FIG. 21 is a flowchart showing a reading operation on a lower page in the NAND type flash memory according to Embodiment 2 of the present invention.
Figure 22:
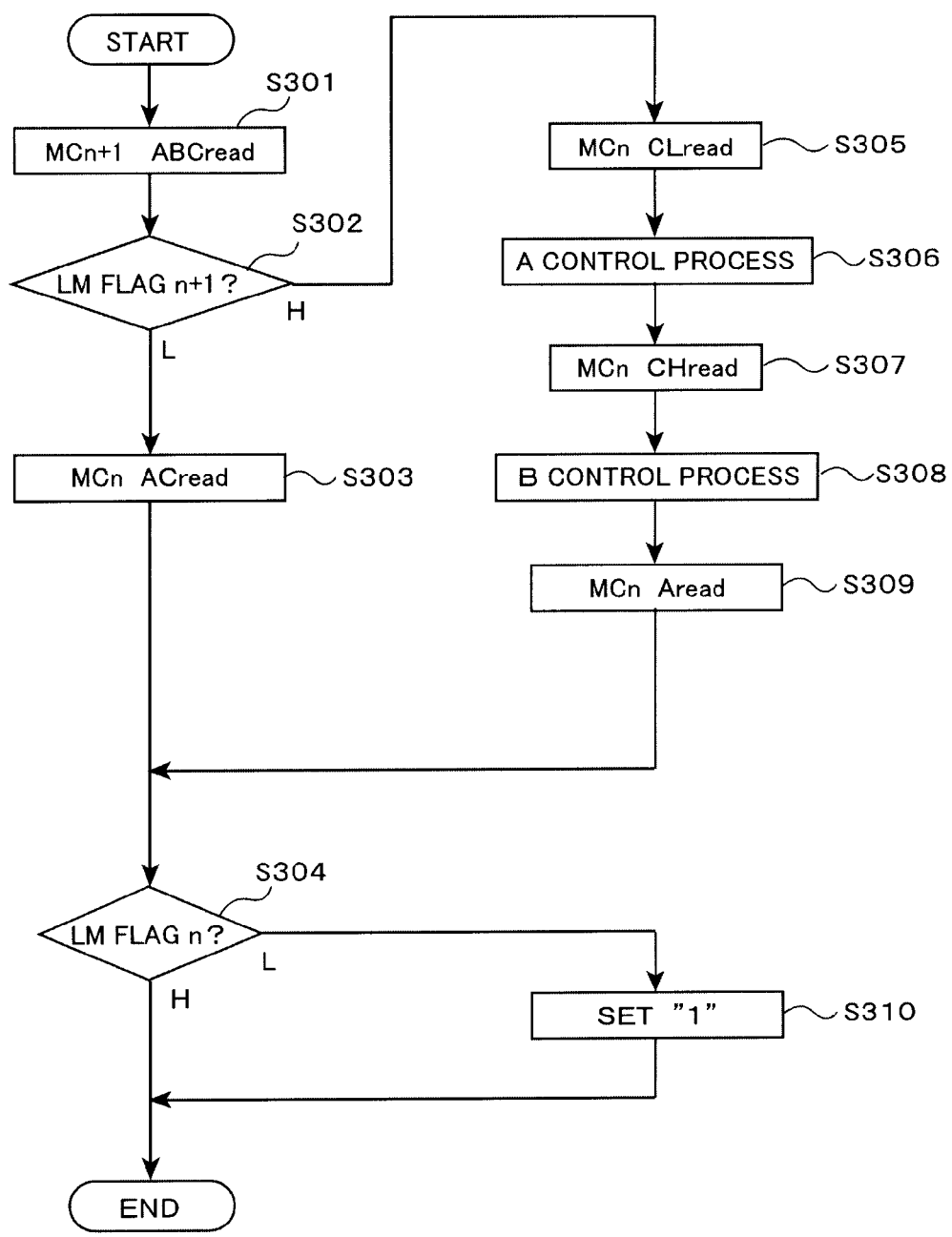
FIG. 22 is a flowchart showing a reading operation on an upper page in the NAND type flash memory according to Embodiment 2 of the present invention.

Now, a reading operation of the NAND type flash memory 100 according to Embodiment 2 of the present invention will be described with reference to FIG. 21 and FIG. 22. FIG. 21 is a flowchart showing a reading operation on a lower page performed by the NAND type flash memory 100. FIG. 22 is a flowchart showing a reading operation on an upper page performed by the NAND type flash memory 100.

First, the reading operation on a lower page will be described. The reading control circuit 101 reads the threshold distribution in the floating gate of the selecting memory cell MCn at the first reading voltage Aread (S201 in FIG. 21). Next, the reading control circuit 101 checks the LM flag n of the selecting memory cell MCn (S202 in FIG. 21). The LM flag n stores information representing whether or not data is programmed in the upper page of the selecting memory cell MCn. When the LM flag n is at the "H" level, it means that data is programmed in the upper page of the selecting memory cell MCn. When the LM flag n is at the "L" level as the result of the check, the reading control circuit 101 reads the data from the selecting memory cell MCn at the first reading voltage Aread and makes a determination on the reading result.

By contrast, when the LM flag n is at the "H" level, the reading control circuit 101 selects the adjacent memory cell MCn+1 and reads the threshold distribution in the floating gate thereof at the first reading voltage Aread, the second reading voltage Bread and the fifth reading voltage CLread (Cread) (S203 in FIG. 21).

Then, the reading control circuit 101 checks the LM flag n+1 of the adjacent memory cell MCn+1 (S204 in FIG. 21). The LM flag n+1 stores data representing whether or not data is programmed in the upper page of the adjacent memory cell MCn+1. When the LM flag n+1 is at the "H" level, it means that data is programmed in the upper page of the adjacent memory cell MCn+1.

When the LM flag n+1 is at the "L" level, the reading control circuit 101 selects the selecting memory cell MCn and reads the threshold distribution in the floating gate thereof at the second reading voltage Bread (S205 in FIG. 21).

By contrast, when the LM flag n+1 is at the "H" level, the reading control circuit 101 selects the selecting memory cell MCn and reads the threshold distribution in the floating gate thereof at the third reading voltage BLread (S206 in FIG. 21). Then, the reading control circuit 101 causes the sense amplifier circuit to execute the A control process (S207 in FIG. 21).

Then, the reading control circuit 101 reads the threshold distribution in the floating gate of the selecting memory cell MCn at the fourth reading voltage BHread higher than the third reading voltage BLread (S208 in FIG. 21). The fourth reading voltage BHread corresponds to the first reading voltage verify level. The reading control circuit 101 causes the sense amplifier circuit to execute the B control process on the reading result (S209 in FIG. 21), and reads the result. Thus, the reading operation on the lower page can be performed. FIG. 23 shows combinations of levels in the flowchart shown in FIG. 21. When the result of the B control process shown in FIG. 23 is the "H" level, the reading control circuit 101 determines that the value of the lower page is "0"; whereas when the result of the B control process shown in FIG. 23 is the "L" level, the reading control circuit 101 determines that the value of the lower page is "1".

The reading control circuit 101 selects the adjacent memory cell MCn+1 and reads the threshold distribution in the floating gate thereof at the first reading voltage Aread, the second reading voltage Bread and the fifth reading voltage CLread (S301 in FIG. 22).

The reading control circuit 101 checks the LM flag n+1 of the adjacent memory cell MCn+1 (S302 in FIG. 22). When the LM flag n+1 is at the "L" level, the reading control circuit 101 selects the selecting memory cell MCn and reads the threshold distribution in the floating gate thereof at the first reading voltage Aread and the predetermined reading voltage Cread (S303 in FIG. 22).

Then, the reading control circuit 101 checks the LM flag n of the selecting memory cell MCn (S304 in FIG. 22). When the LM flag n is at the "L" level, the reading control circuit 101 executes a process of forcibly setting the upper page to "1" (S310 in FIG. 22).

By contrast, when the LM flag n+1 is at the "H" level, the reading control circuit 101 selects the selecting memory cell MCn, reads the threshold distribution in the floating gate thereof at the fifth reading voltage CLread (S305 in FIG. 22), and causes the sense amplifier circuit to execute the A control process (S306 in FIG. 22).

Then, the reading control circuit 51 reads the threshold distribution in the floating gate of the selecting memory cell MCn at the sixth reading voltage CHread (S307 in FIG. 22). The sixth reading voltage CHread corresponds to the first reading voltage verify level. The reading control circuit 101 causes the sense amplifier circuit to execute the B control process (S308 in FIG. 22).

The reading control circuit 101 again selects the selecting memory cell MCn, reads the threshold distribution in the floating gate thereof at the first reading voltage Aread (S309 in FIG. 22), and checks the LM flag n (S304 in FIG. 22). Thus, the reading operation on the upper page can be performed. FIG. 24 shows combinations of levels in the flowchart shown in FIG. 22. When the result of the B control process shown in FIG. 24 is the "H" level, the reading control circuit 101 determines that the value of the upper page is "0"; whereas when the result of the B control process shown in FIG. 24 is the "L" level, the reading control circuit 101 determines that the value of the upper page is "1".

As described above, when reading data from a selecting memory cell, the NAND type flash memory 100 reads data from a memory cell adjacent thereto and thus corrects the reading voltage for the selecting memory cell. Namely, the reading voltages of the first and second verify levels can be defined. Owing to this, the NAND type flash memory 100 can suppress the influence by the coupling noise and thus provide high reliability.

Now, a specific example of the programming operation and the reading operation of the NAND type flash memory 100 will be described with reference to FIG. 25A, FIG. 25B, FIG. 26A and FIG. 26B, which show a change in the threshold distribution.

Figure 25A:
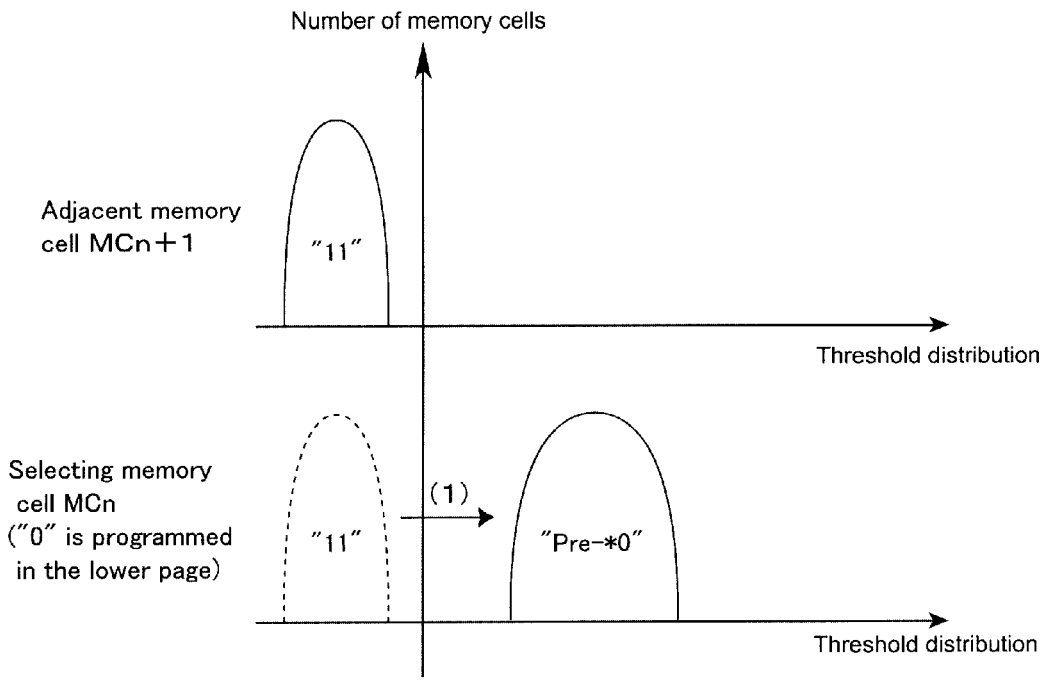
FIG. 25A shows a threshold distribution in a selecting memory cell in the NAND type flash memory according to Embodiment 2 of the present invention, before data is programmed to an adjacent memory cell adjacent to the selecting memory cell.
Figure 25B:
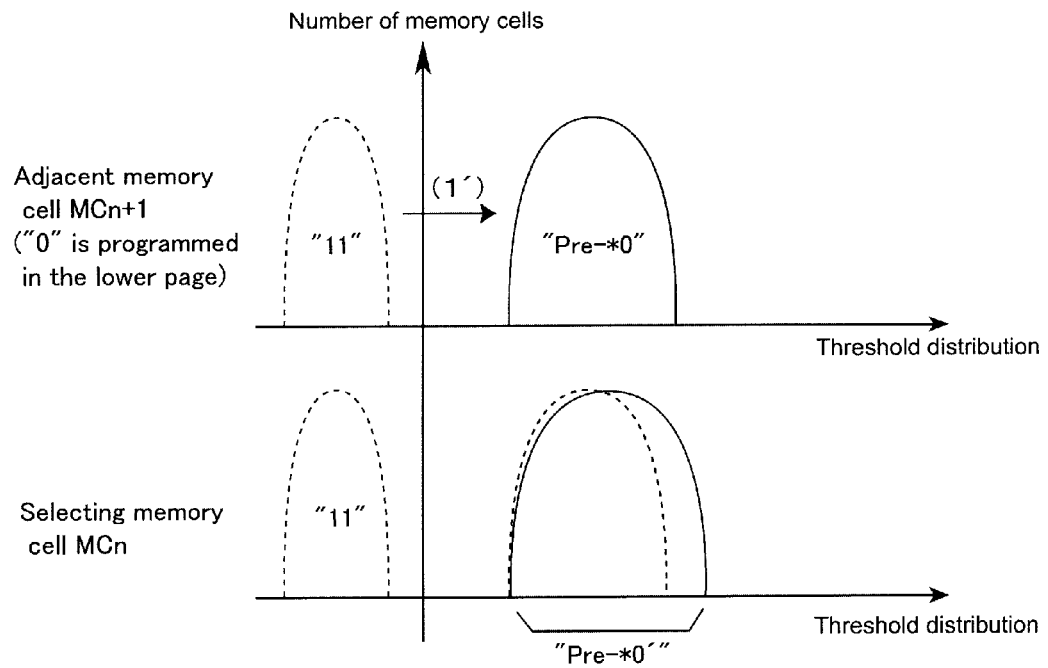
FIG. 25B shows a threshold distribution in the adjacent memory cell and the selecting memory cell in the NAND type flash memory according to Embodiment 2 of the present invention, after data is programmed to the adjacent memory cell.

FIG. 25A shows a threshold distribution in the floating gate of the selecting memory cell MCn before data is programmed to the adjacent memory cell MCn+1. FIG. 25B shows a threshold distribution in the floating gates of the adjacent memory cell MCn+1 and the selecting memory cell MCn after data is programmed to the adjacent memory cell MCn+1.

Figure 26A:
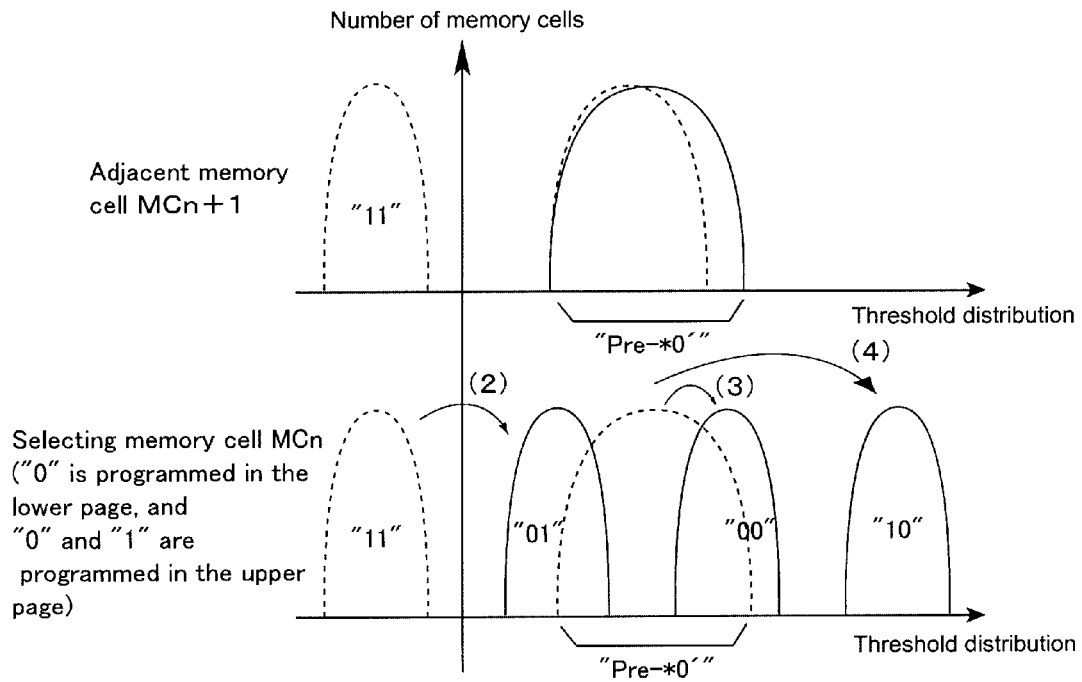
FIG. 26A shows how data is programmed to a lower page and an upper page of the selecting memory cell in the NAND type flash memory according to Embodiment 2 of the present invention after the state in FIG. 25B, and the threshold distribution in the adjacent memory cell.
Figure 26B:
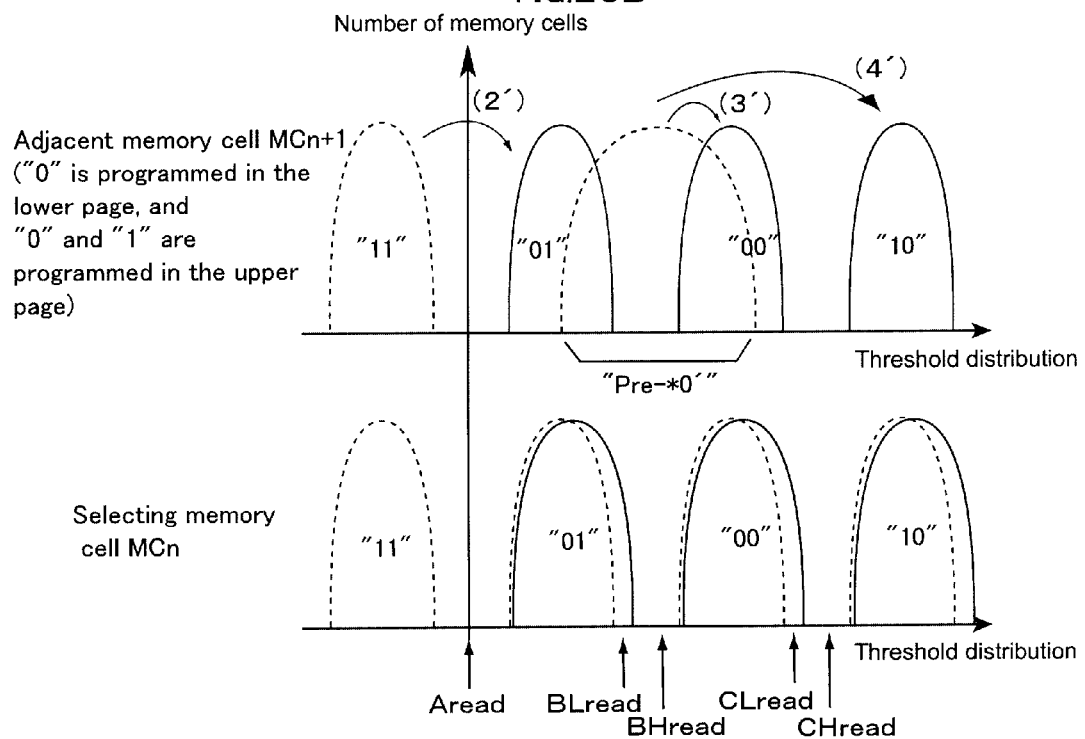
FIG. 26B shows how data is programmed to a lower page and an upper page of the adjacent memory cell in the NAND type flash memory according to Embodiment 2 of the present invention after the state in FIG. 26A, and the threshold distribution in the selecting memory cell.

FIG. 26A shows how data is programmed to the lower page and the upper page of the selecting memory cell MCn after the state in FIG. 25B, and the threshold distribution in the floating gate of the adjacent memory cell MCn+1. FIG. 26B shows how data is programmed to the lower page and the upper page of the adjacent memory cell MCn+1 after the state in FIG. 26A, and the threshold distribution in the floating gate of the selecting memory cell MCn.

First, a data programming operation on the selecting memory cell MCn and the adjacent memory cell MCn+1 will be described. As shown in FIG. 25A, initially, the threshold distribution in the floating gate of the adjacent memory cell MCn+1 is in the "11" state, i.e., the memory cell is in an erasure cell state. Referring to FIG. 25A, when the "0" data is programmed to the lower page of the selecting memory cell MCn at (1), the threshold distribution in the floating gate is shifted to the "Pre-*0" state. The "Pre-*0" state is a threshold distribution approximately in the middle between the "01" state and the "00" state.

Referring to FIG. 25B, when the "0" data is programmed to the lower page of the adjacent memory cell MCn+1 at (1'), the threshold distribution in the floating gate is shifted to the "Pre-*0" state. Here again, the "Pre-*0" state is a threshold distribution approximately in the middle between the "01" state and the "00" state. The data programming made to the adjacent memory cell MCn+1 causes coupling between the floating gates of the adjacent memory cell MCn+1 and the selecting memory cell MCn. Due to this coupling, the threshold distribution in the floating gate of the selecting memory cell MCn is shifted from the "Pre-*0" state to the "Pre-*0'" state as shown in FIG. 25B. The dashed line in FIG. 25B represents the threshold distribution of the corresponding state in FIG. 25A.

Referring to FIG. 26A, when the "1" data is programmed to the lower page of the selecting memory cell MCn and the "0" data and the "1" data are sequentially programmed to the upper page of the selecting memory cell MCn at (2) through (4), the threshold distribution in the floating gate is shifted from the "Pre-*0'" state to the "01", "00" and "10" states. The data programming made to the selecting memory cell MCn shifts the threshold distribution in the floating gate of the adjacent memory cell MCn+1 from the "Pre-*0" state to the "Pre-*0'" state. The dashed line in FIG. 26A represents the threshold distribution of the corresponding state in FIG. 25B.

Referring to FIG. 26B, when the "1" data is programmed to the lower page of the adjacent memory cell MCn+1 and the "0" data and the "1" data are sequentially programmed to the upper page of the adjacent memory cell MCn+1 at (2') through (4'), the threshold distribution in the floating gate is shifted from the "Pre-*0" state to the "01", "00" and "10" states. The data programming made to the adjacent memory cell MCn+1 shifts the threshold distribution in the floating gate of the selecting memory cell MCn from the distribution represented with the dashed line in FIG. 26B (the threshold distribution in FIG. 26A after the data is programmed) to the distribution represented with the solid line in FIG. 26B for each state.

Now, a data reading operation on data programmed in the lower page by the programming operation shown in FIG. 26B will be described. The reading control circuit 101 in the NAND type flash memory 100 reads the threshold distribution in the floating gate of the selecting memory cell MCn at the first reading voltage Aread (S201 in FIG. 21). Then, the reading control circuit 101 checks the LM flag n of the selecting memory cell MCn (S202 in FIG. 21). When the LM flag n is at the "L" level, the reading control circuit 101 makes a determination on the value read at the first reading voltage Aread.

By contrast, when the LM flag n is at the "H" level, the reading control circuit 101 selects the adjacent memory cell MCn+1 and reads the threshold distribution in the floating gate thereof at the first reading voltage Aread, the second reading voltage Bread and the fifth reading voltage CLread (Cread) (S203 in FIG. 21). Then, the reading control circuit 101 checks the LM flag n+1 of the adjacent memory cell MCn+1 (S204 in FIG. 21).

When the LM flag n+1 is at the "L" level, the reading control circuit 101 selects the selecting memory cell MCn and reads the threshold distribution in the floating gate thereof at the second reading voltage Bread (S205 in FIG. 21).

By contrast, when the LM flag n+1 is at the "H" level, the reading control circuit 101 selects the selecting memory cell MCn and reads the threshold distribution in the floating gate thereof at the third reading voltage BLread (S206 in FIG. 21). Then, the reading control circuit 101 causes the sense amplifier circuit to execute the A control process (S207 in FIG. 21).

Then, the reading control circuit 101 reads the threshold distribution in the floating gate of the selecting memory cell MCn at the fourth reading voltage BHread (first reading voltage verify level) higher than the third reading voltage BLread (S208 in FIG. 21). The reading control circuit 101 causes the sense amplifier circuit to execute the B control process on the reading result (S209 in FIG. 21), and reads the result. Thus, the reading operation on the lower page of the selecting memory cell MCn programmed in FIG. 26B can be performed.

Next, a data reading operation on data programmed in the upper page by the programming operation shown in FIG. 26B will be described. The reading control circuit 101 selects the adjacent memory cell MCn+1 and reads the threshold distribution in the floating gate thereof at the first reading voltage Aread, the second reading voltage Bread and the fifth reading voltage CLread (Cread) (S301 in FIG. 22).

Then, the reading control circuit 101 checks the LM flag n+1 of the adjacent memory cell MCn+1 (S302 in FIG. 22). When the LM flag n+1 is at the "L" level, the reading control circuit 101 selects the selecting memory cell MCn and reads the threshold distribution in the floating gate thereof at the first reading voltage Aread and the predetermined reading voltage Cread (S303 in FIG. 22).

Then, the reading control circuit 101 checks the LM flag n of the selecting memory cell MCn (S304 in FIG. 22). When the LM flag n is at the "L" level, the reading control circuit 101 executes a process of forcibly setting the upper page to "1" (S310 FIG. 22).

By contrast, when the LM flag n+1 is at the "H" level, the reading control circuit 101 selects the selecting memory cell MCn, reads the threshold distribution in the floating gate thereof at the fifth reading voltage CLread (S305 in FIG. 22), and causes the sense amplifier circuit to execute the A control process (S306 in FIG. 22).

Then, the reading control circuit 101 reads the threshold distribution in the floating gate of the selecting memory cell MCn at the sixth reading voltage CHread (second verify level) (S307 in FIG. 22), and causes the sense amplifier circuit to execute the B control process (S308 in FIG. 22).

Then, the reading control circuit 101 again selects the selecting memory cell MCn, reads the threshold distribution in the floating gate thereof at the first reading voltage Aread (S309 in FIG. 22), and checks the LM flag n (S304 in FIG. 22). Thus, the reading operation on the upper page of the selecting memory cell MCn programmed in FIG. 26B can be performed.

Embodiment 3

Figure 27:
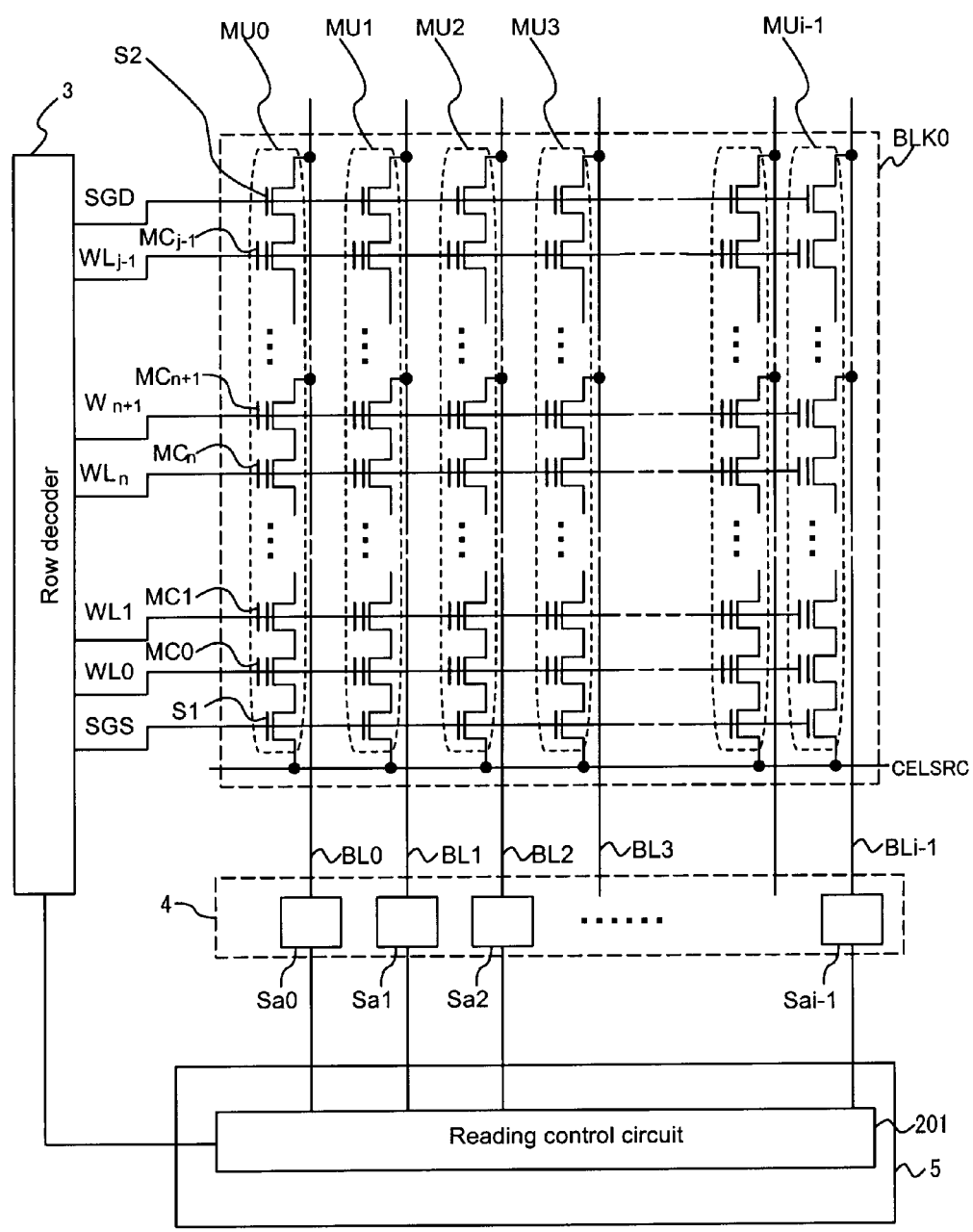
FIG. 27 is a schematic block diagram showing a memory cell block in a NAND type flash memory according to Embodiment 3 of the present invention.

Next, Embodiment 3 of the present invention will be described with reference to the drawings. FIG. 27 is a block diagram showing an exemplary detailed structure of one of a plurality of memory cell blocks BLK0, BLK1, BLKm−1 (for example, BLK0) in a NAND type flash memory 200 according to Embodiment 3 of the present invention. In Embodiment 3, elements having the same or similar functions as those in Embodiments 1 and 2 bear the same reference numerals therewith, and detailed descriptions thereof will be omitted.

As shown in FIG. 27, the NAND type flash memory 200 according to Embodiment 3 of the present invention includes a reading control circuit 201 instead of the reading control circuit 51 included in the NAND type flash memory 1 according to Embodiment 1 of the present invention. The NAND type flash memory 200 also includes a plurality of sense amplifier circuits Sa0, Sa1, ..., Sai−1 instead of the plurality of sense amplifier circuits SA0, SA1, SAi−1 included in the NAND type flash memory 1 according to Embodiment 1.

The reading and programming circuit section 4 includes the plurality of (i pieces of) sense amplifier circuits Sa0, Sa1, ..., Sai−1. The peripheral circuit section 5 includes the reading control circuit 201. The reading control circuit 201 is connected to the plurality of (i pieces of) sense amplifier circuits Sa0, Sa1, ..., Sai−1 and the row decoder 3. The sense amplifier circuits Sa0, Sa1, ..., Sai−1 are well known, and are connected to the bit lines BL0, BL1, ..., BLi−1, respectively. The sense amplifier circuits Sa0, Sa1, ..., Sai−1 detect data from the memory cells MC0, MC1, ..., MCn, MCn+1, ..., MCj−1 via the bit lines BL0, BL1, ..., BLi−1 and supplies the data to the reading control circuit 201. The reading control circuit 201 controls the plurality of (i pieces of) sense amplifier circuits Sa0, Sa1, ..., Sai−1 and the row decoder 3 to read data from each of the memory cells MC0, MC1, ..., MCn, MCn+1, ..., MCj−1.

The reading and programming control circuit section 4 and the reading control section 201 form a data reading and programming control section for, when performing 4-value data programming, read and erasure with respect to the plurality of memory cells MC0, MC1, ..., MCn, MCn+1, ..., MCj−1, selecting and applying a voltage to a corresponding word line and a corresponding bit line among the plurality of word lines WL0, WL1, ..., WLn, WLn+1, ..., WLj−1 and the plurality of bit lines BL0, BL1, ..., BLi−1.

Figure 28:
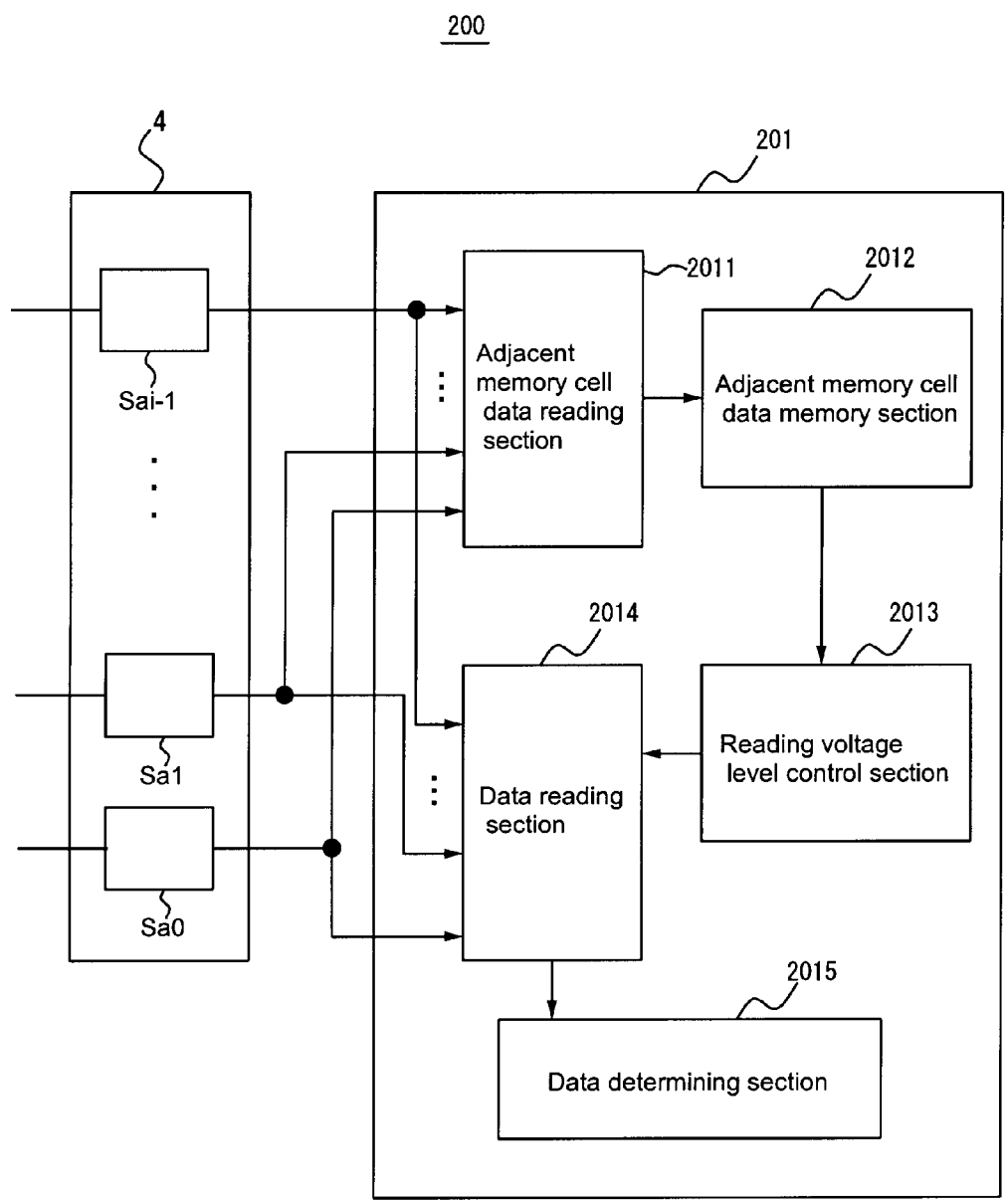
FIG. 28 is a block diagram showing a reading control circuit in the NAND type flash memory according to Embodiment 3 of the present invention.

FIG. 28 is a block diagram showing a structure of the reading control circuit 201 in the NAND type flash memory 200 according to Embodiment 3 of the present invention.

As shown in FIG. 28, the reading control circuit 201 includes an adjacent memory cell data reading section 2011, an adjacent memory cell data memory section 2012, a reading voltage level control section 2013, a data reading section 2014, and a data determining section 2015.

The adjacent memory cell data reading section 2011 is connected to the sense amplifier circuits Sa0, Sa1, ..., Sai−1. The adjacent memory cell data reading section 2011 reads whether or not data is programmed in the lower page of the adjacent memory cell MCn+1 adjacent to the selecting memory cell MCn at the second reading voltage Bread via the sense amplifier circuits Sa0, Sa1, ..., Sai−1, and generates adjacent memory cell state data representing a data state of the adjacent memory cell MCn+1.

The adjacent memory cell data memory section 2012 is connected to the adjacent memory cell data reading section 2011. The adjacent memory cell data memory section 2012 stores the adjacent memory cell state data generated by the adjacent memory cell data reading section 2011.

The reading voltage level control section 2013 is connected to the adjacent memory cell data memory section 2012. The reading voltage level control section 2013 controls the reading voltage level for reading data from the selecting memory cell MCn before data is programmed to the adjacent memory cell MCn+1. Specifically, before 4-value data programmed in the selecting memory cell MCn is read, the reading voltage level control section 2013 controls the reading voltage level to one of voltage levels between the 4-value data threshold distributions. The voltage levels between the 4-value data threshold distributions are defined as first, second and third reading voltage levels from the lowest level. The reading voltage level control section 2013 also defines first and second reading voltage verify levels which are higher than the second and third reading voltage levels by a predetermined value, based on the adjacent memory cell state data stored on the adjacent memory cell data memory section 2012.

The data reading section 2014 is connected to the reading voltage level control section 2013, the sense amplifier circuits Sa0, Sa1, ..., Sai−1, and the data determining section 2015. The data reading section 2014 receives data on the first reading voltage level and the first and second reading voltage verify levels from the reading voltage level control section 2013.

Based on the first reading voltage level and the first and second reading voltage verify levels, the data reading section 2014 reads data from the selecting memory cell MCn via a corresponding sense amplifier circuit among the sense amplifier circuits Sa0, Sa1, ..., Sai−1 at the first reading voltage Aread, the fourth reading voltage BHread and the sixth reading voltage CHread, and supplies the data to the data determining section 2015.

Based on the data read by the data reading section 2014, the data determining section 2015 determines which value among the 4-value data is programmed in the selecting memory cell MCn.

As described above, when reading data from a selecting memory cell, the NAND type flash memory 200 reads data from a memory cell adjacent thereto and thus corrects the reading voltage for the selecting memory cell. Namely, the reading voltages of the first and second verify levels can be defined. Owing to this, the NAND type flash memory 200 can suppress the influence by the coupling noise and thus provide high reliability.

Embodiment 4

Figure 29:
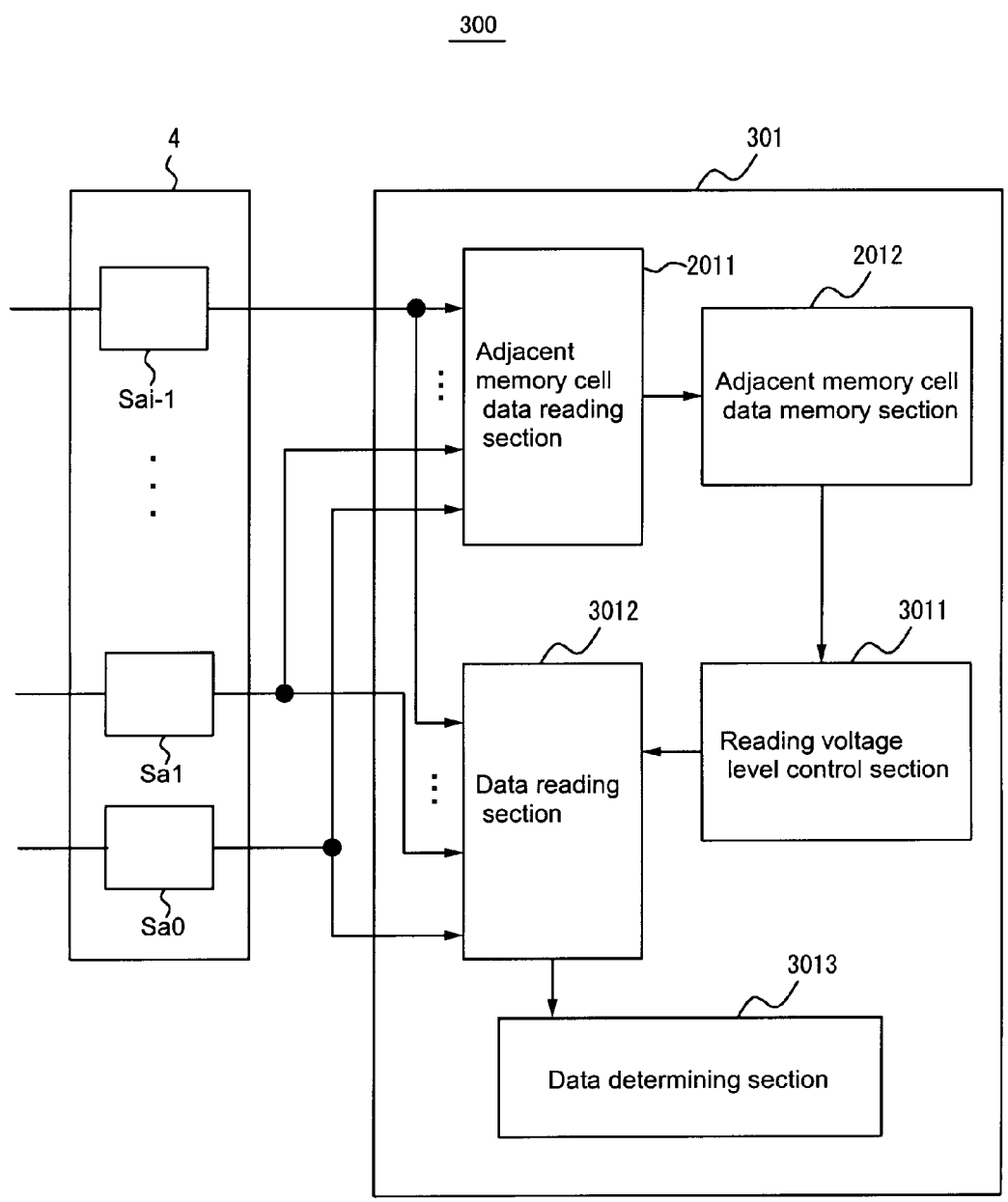
FIG. 29 is a block diagram showing a reading control circuit in a NAND type flash memory according to Embodiment 4 of the present invention.

Next, Embodiment 4 of the present invention will be described with reference to the drawing. FIG. 29 is a block diagram showing a structure of the reading control circuit 301 in a NAND type flash memory 300 according to Embodiment 4 of the present invention. In Embodiment 4, elements having the same or similar functions as those in Embodiment 3 bear the same reference numerals therewith, and detailed descriptions thereof will be omitted.

As shown in FIG. 29, the reading control circuit 301 includes a reading voltage level control section 3011, a data reading section 3012, and a data determining section 3013 instead of the reading voltage level control section 2013, the data reading section 2014, and the data determining section 2015 included in the reading control section 201 in the NAND type flash memory 200 according to Embodiment 3 of the present invention.

Namely, the reading control circuit 301 includes the adjacent memory cell data reading section 2011, the adjacent memory cell data memory section 2012, the reading voltage level control section 3011, the data reading section 3012, and the data determining section 3013.

The reading voltage level control section 3011 is connected to the adjacent memory cell data memory section 2012. The reading voltage level control section 3011 controls the reading voltage level for reading data from the selecting memory cell MCn before data is programmed to the adjacent memory cell MCn+1. Specifically, before 4-value data programmed in the selecting memory cell MCn is read, the reading voltage level control section 3011 controls the reading voltage level to one of voltage levels between the 4-value data threshold distributions. The voltage levels between the 4-value data threshold distributions are defined as first, second and third reading voltage levels from the lowest level. The reading voltage level control section 3011 also defines the first and second reading voltage verify levels which are higher than the second and third reading voltage levels by a predetermined value, based on the adjacent memory cell state data stored on the adjacent memory cell data memory section 2012.

The data reading section 3012 is connected to the reading voltage level control section 3011, the sense amplifier circuits Sa0, Sa1, . . . , Sai−1, and the data determining section 3013. The data reading section 3012 receives information on the first, second and third reading voltage levels and the first and second reading voltage verify levels from the reading voltage level control section 3011.

Based on the first, second and third reading voltage levels and the first and second reading voltage verify levels, the data reading section 3012 reads data from the selecting memory cell MCn via a corresponding sense amplifier circuit among the sense amplifier circuits Sa0, Sa1, . . . , Sai−1 at the first, third and fifth reading voltages Aread, BLread and CLread and the fourth and sixth reading voltages BHread and CHread, and supplies the data to the data determining section 3013.

Based on the data read by the data reading section 3012, the data determining section 3013 determines which value among the 4-value data is programmed in the selecting memory cell MCn.

As described above, when reading data from a selecting memory cell, the NAND type flash memory 300 reads data from a memory cell adjacent thereto and thus corrects the reading voltage for the selecting memory cell. Namely, the reading voltages of the first and second verify levels can be defined. Owing to this, the NAND type flash memory 300 can suppress the influence by the coupling noise and thus provide high reliability.

The present invention is also applicable to the case where before data is read from the selecting memory cell MCn, data is programmed to an adjacent memory cell other than the adjacent memory cell MCn+1 adjacent to the selecting memory cell MCn to change the threshold distribution of the selecting memory cell MCn.

Embodiment 5

Figure 30:
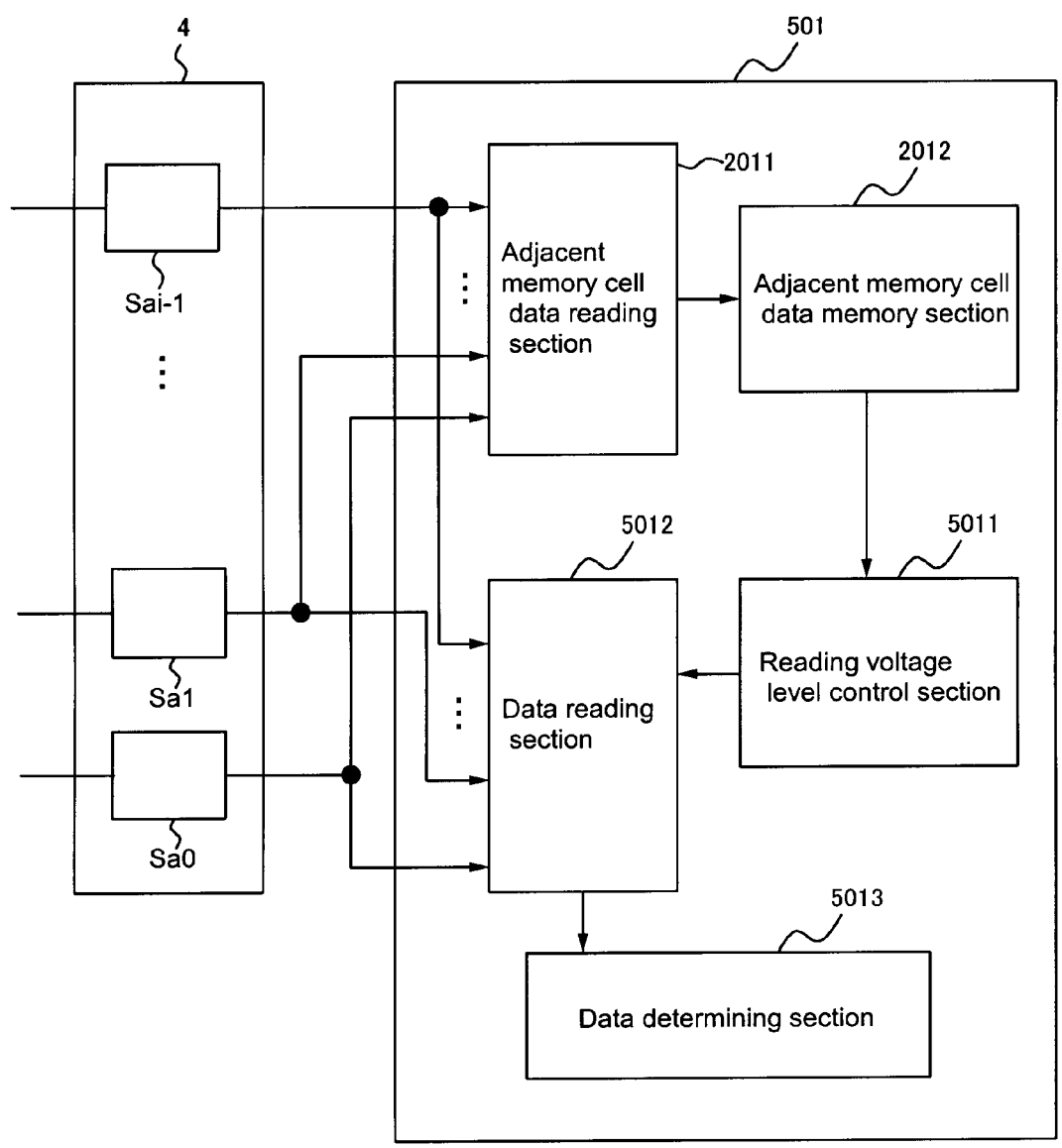
FIG. 30 is a block diagram showing a reading control circuit in a NAND type flash memory according to Embodiment 5 of the present invention.

Next, Embodiment 5 of the present invention will be described with reference to the drawings. FIG. 30 is a block diagram showing a structure of a reading control circuit 501 in a NAND type flash memory 500 according to Embodiment 5 of the present invention. In Embodiment 5, elements having the same or similar functions as those in Embodiment 3 bear the same reference numerals therewith, and detailed descriptions thereof will be omitted.

As shown in FIG. 30, the reading control circuit 501 includes a reading voltage level control section 5011, a data reading section 5012, and a data determining section 5013 instead of the reading voltage level control section 2013, the data reading section 2014, and the data determining section 2015 included in the reading control section 201 in the NAND type flash memory 200 according to Embodiment 3 of the present invention.

Namely, the reading control circuit 501 includes the adjacent memory cell data reading section 2011, the adjacent memory cell data memory section 2012, the reading voltage level control section 5011, the data reading section 5012, and the data determining section 5013.

The reading voltage level control section 5011 is connected to the adjacent memory cell data memory section 2012. The reading voltage level control section 5011 controls the reading voltage level for reading data from the selecting memory cell MCn before data is programmed to the adjacent memory cell MCn+1. Specifically, before 8-value data (described later) programmed in the selecting memory cell MCn is read, the reading voltage level control section 5011 controls the reading voltage level to one of voltage levels between the 8-value data threshold distributions. The voltage levels between the 8-value data threshold distributions are defined as first, third, fifth, seventh, ninth, eleventh and thirteenth reading voltage levels from the lowest level. The reading voltage level control section 5011 also defines the first, second and third reading voltage verify levels which are higher than the third, seventh and eleventh reading voltage levels by a predetermined value, based on the adjacent memory cell state data stored on the adjacent memory cell data memory section 2012.

The data reading section 5012 is connected to the reading voltage level control section 5011, the sense amplifier circuits Sa0, Sa1, . . . , Sai−1, and the data determining section 5013. The data reading section 5012 receives information on the first, third, fifth, seventh, ninth, eleventh and thirteenth reading voltage levels and the first, second and third reading voltage verify levels from the reading voltage level control section 5011.

Based on the first, third, fifth, seventh, ninth, eleventh and thirteenth reading voltage levels and the first, second and third reading voltage verify levels, the data reading section 5012 reads data from the selecting memory cell MCn via a corresponding sense amplifier circuit among the sense amplifier circuits Sa0, Sa1, . . . , Sai−1 at the first, third, fifth, seventh, ninth, eleventh and thirteenth reading voltages Aread, BLread, CLread, DLread, ELread, FLread and GLread and fourth, sixth, eighth, tenth, twelfth and fourteenth reading voltages BHread, CHread, DHread, EHread, FHread and GHread, and supplies the data to the data determining section 5013.

Based on the data read by the data reading section 5012, the data determining section 5013 determines which value among the 8-value data is programmed in the selecting memory cell MCn.

Next, an 8-value data programming operation on the NAND type flash memory 500 according to Embodiment 5 of the present invention will be described with reference to FIG. 31A, FIG. 31B, FIG. 32A and FIG. 32B which show a change in the threshold distribution.

Figure 32A:
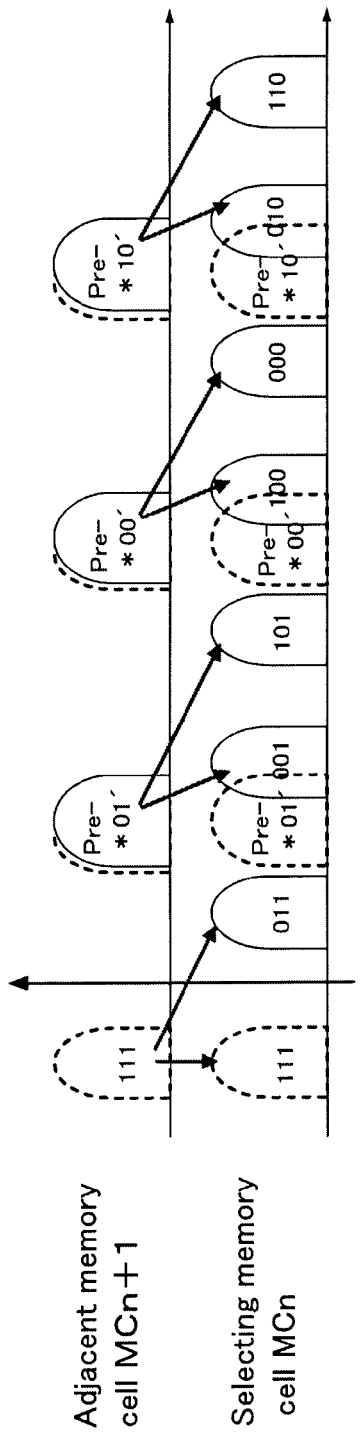
FIG. 32A shows how data is programmed to a lower page, a middle page and an upper page of a selecting memory cell in the NAND type flash memory according to Embodiment 5 of the present invention after the state in FIG. 31B, and the threshold distribution in an adjacent memory cell adjacent to the selecting memory cell.
Figure 32B:
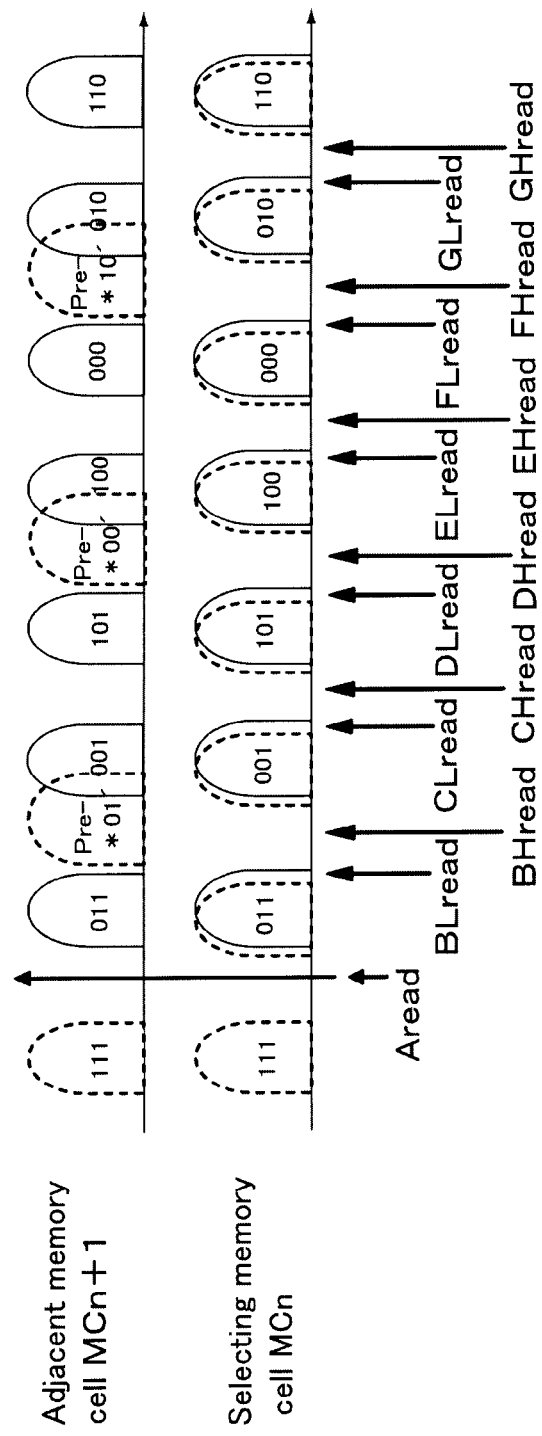
FIG. 32B shows how data is programmed to a lower page, a middle page and an upper page of the adjacent memory cell in the NAND type flash memory according to Embodiment 5 of the present invention after the state in FIG. 32A, and the threshold distribution in the selecting memory cell.

In Embodiment 5, as shown in FIG. 32B, eight states ("111", "011", "001", "101", "100", "000", "010", "110" from the left of the figure) are provided for the threshold distribution in the floating gate, and 3-bit (8-value) data can be stored on a memory cell by placing the floating gate into any one of the eight states.

The above representation indicates that three data (3-digit data) are programmed to a memory cell in the NAND type flash memory 500. Hereinafter, first data (in the case of "011" above, "0" on the right digit) will be referred to as the "lower page", second data (in the case of "011" above, "0" (second digit from the right) will be referred to as the "middle page", and third data (in the case of "011" above, "1" on the left digit) will be referred to as the "upper page".

FIG. 31A shows a threshold distribution in the floating gates of the selecting memory cell MCn before data is programmed to the adjacent memory cell MCn+1. FIG. 31B shows a threshold distribution in the floating gates of the adjacent memory cell MCn+1 and the selecting memory cell MCn after data is programmed to the adjacent memory cell MCn+1.

FIG. 32A shows how data is programmed to the lower page, the middle page and the upper page of the selecting memory cell MCn after the state in FIG. 31B, and the threshold distribution in the floating gate of the adjacent memory cell MCn+1. FIG. 32B shows how data is programmed to the lower page, the middle page and the upper page of the adjacent memory cell MCn+1 after the state in FIG. 32A, and the threshold distribution in the floating gate of the selecting memory cell MCn.

As shown in FIG. 31A, initially, the threshold distribution in the floating gate of the adjacent memory cell MCn+1 is in the "111" state, i.e., the memory cell is in an erasure cell state. Referring to FIG. 31A, when the "0" data is programmed to the lower page and the middle page of the selecting memory cell MCn, the threshold distribution in the floating gate is shifted to the "Pre-*01" state, the "Pre-*00" state and the "Pre-*10" state. The "Pre-*01" state is a threshold distribution approximately in the middle between the "011" state and the "001" state. The "Pre-*00" state is a threshold distribution approximately in the middle between the "101" state and the "100" state. The "Pre-*10" state is a threshold distribution approximately in the middle between the "000" state and the "010" state.

Referring to FIG. 31B, when the "0" data is programmed to the lower page and the middle page of the adjacent memory cell MCn+1, the threshold distribution in the floating gate is shifted to the "Pre-*01" state, the "Pre-*00" state and the "Pre-*10" state. Here again, the "Pre-*01" state is a threshold distribution approximately in the middle between the "011" state and the "001" state. The "Pre-*00" state is a threshold distribution approximately in the middle between the "101" state and the "100" state. The "Pre-*10" state is a threshold distribution approximately in the middle between the "000" state and the "010" state.

The data programming made to the adjacent memory cell MCn+1 causes coupling between the floating gates of the adjacent memory cell MCn+1 and the selecting memory cell MCn. Due to this coupling, the threshold distribution in the floating gate of the selecting memory cell MCn is shifted from the "Pre-*01" state to the "Pre-*01'" state, from the "Pre-*00" state to the "Pre-*00'" state, and from the "Pre-*10" state to the "Pre-*10'" state as shown in FIG. 31B. The dashed line in FIG. 31B represents the threshold distribution of the corresponding state in FIG. 31A.

Referring to FIG. 32A, when the "0" data and the "1" data are sequentially programmed to the upper page of the selecting memory cell MCn, the threshold distribution in the floating gate is shifted from the "Pre-*01'" state to the "001" state and the "101" state, from the "Pre-*00'" state to the "100" state and the "000" state, and from the "Pre-*10'" state to the "010" state and the "110" state.

The data programming made to the selecting memory cell MCn shifts the threshold distribution in the floating gate of the adjacent memory cell MCn+1 from the "Pre-*01" state to the "Pre-*01'" state, from the "Pre-*00" state to the "Pre-*00'" state, and from the "Pre-*10" state to the "Pre-*10'" state. The dashed line in FIG. 32A represents the threshold distribution of the corresponding state in FIG. 31B.

Referring to FIG. 32B, when the "0" data and the "1" data are sequentially programmed to the upper page of the adjacent memory cell MCn+1, the threshold distribution in the floating gate is shifted from the "Pre-*01'" state to the "001" state and the "101" state, from the "Pre-*00'" state to the "100" state and the "000" state, and from the "Pre-*10'" state to the "010" state and the "110" state. The data programming made to the adjacent memory cell MCn+1 shifts the threshold distribution in the floating gate of the selecting memory cell MCn from the distribution represented with the dashed line in FIG. 32B (the threshold distribution in FIG. 32A after the data is programmed) to the distribution represented with the solid line in FIG. 32B for each state.

Figure 33:
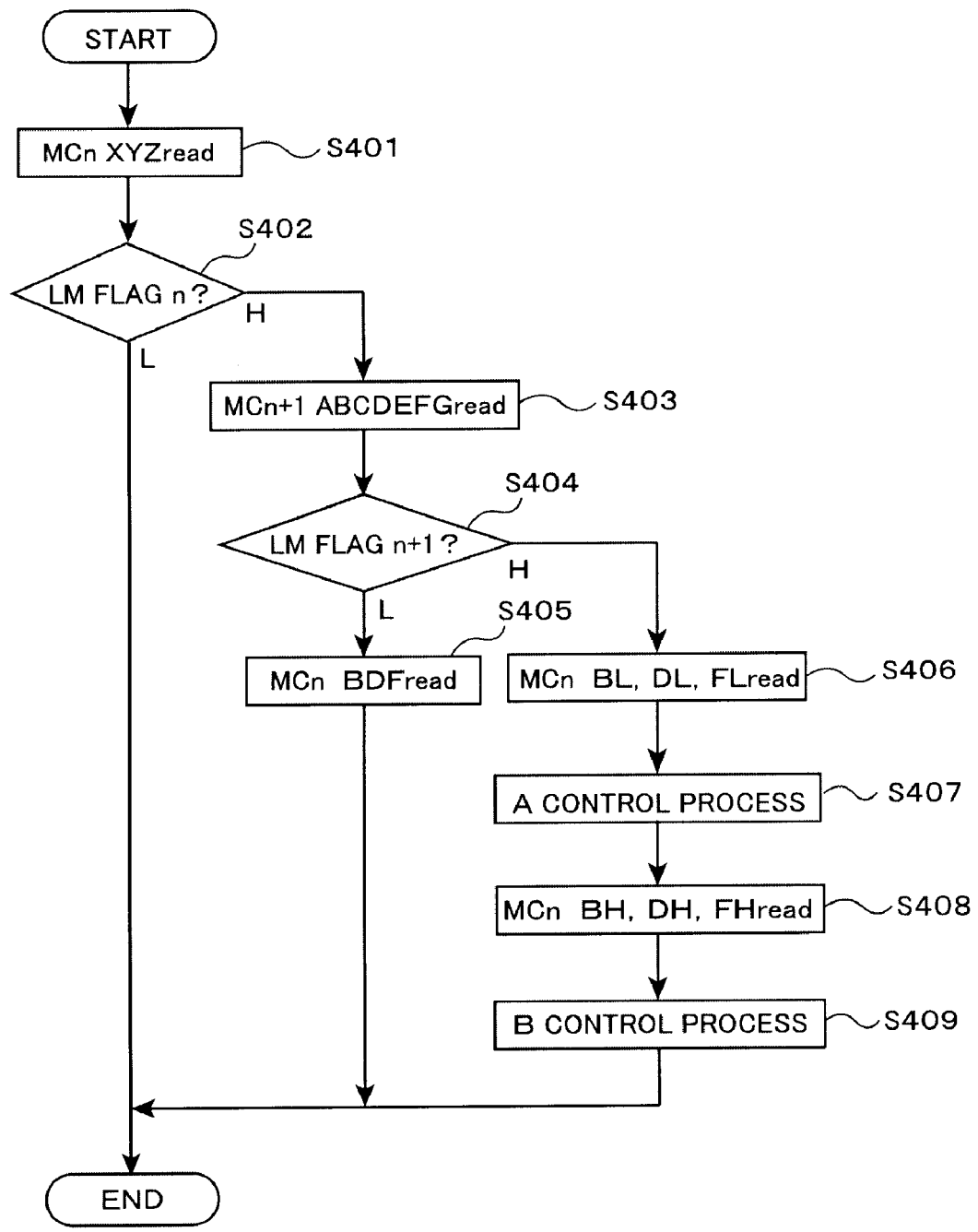
FIG. 33 is a flowchart showing a reading operation on a lower page and a middle page in the NAND type flash memory according to Embodiment 5 of the present invention.
Figure 34:
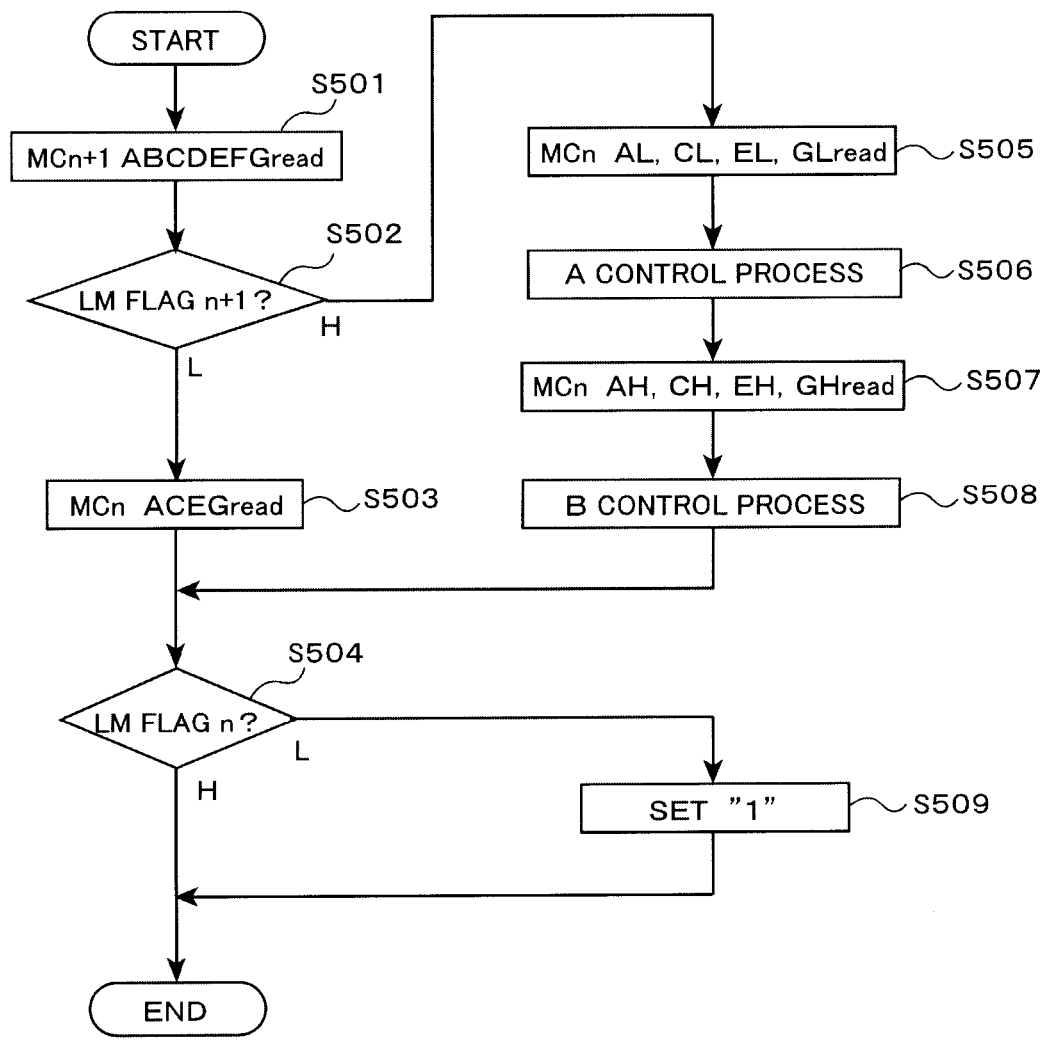
FIG. 34 is a flowchart showing a reading operation on an upper page in the NAND type flash memory according to Embodiment 5 of the present invention.

Next, a reading operation of the NAND type flash memory 500 according to Embodiment 5 of the present invention will be described with reference to FIG. 33 and FIG. 34. FIG. 33 is a flowchart showing a reading operation on a lower page and a middle page performed by the NAND type flash memory 500. FIG. 34 is a flowchart showing a reading operation on an upper page performed by the NAND type flash memory 500.

First, a reading operation on a lower page and a middle page will be described. The reading control circuit 501 in the NAND type flash memory 500 reads the threshold distribution in the floating gate of the selecting memory cell MCn at predetermined reading voltages Xread, Yread and Zread (see FIG. 31A) corresponding to values between "Pre-*01", "Pre-*00" and "Pre-*10" (S401 in FIG. 33). Next, the reading control circuit 501 checks the LM flag of the selecting memory cell MCn (S402 in FIG. 33). When the LM flag n is at the "L" level, the reading control circuit 501 makes a determination on the values read at the predetermined reading voltages Xread, Yread and Zread.

By contrast, when the LM flag n is at the "H" level, the reading control circuit 501 selects the adjacent memory cell MCn+1, reads the threshold distribution in the floating gate thereof at the first reading voltage Aread, the second reading voltage Bread, and predetermined reading voltages Cread, Dread, Eread, Fread and Gread (S403 in FIG. 33), and checks the LM flag n+1 of the adjacent memory cell MCn+1 (S404 in FIG. 33).

When the LM flag n+1 is at the "L" level, the reading control circuit 501 selects the selecting memory cell MCn and reads the threshold distribution in the floating gate thereof at the second reading voltage Bread and predetermined reading voltages Dread and Fread (S405 in FIG. 33).

By contrast, when the LM flag n+1 is at the "H" level, the reading control circuit 501 selects the selecting memory cell MCn and reads the threshold distribution in the floating gate thereof at the third, seventh and eleventh reading voltages BLread, DLread and FLread (S406 in FIG. 33). Then, the reading control circuit 501 causes the sense amplifier circuit to execute the A control process (S407 in FIG. 33).

Then, the reading control circuit 501 reads the threshold distribution in the floating gate of the selecting memory cell MCn at the fourth, eighth and twelfth reading voltages BHread (first verify level), DHread (second verify level) and FHread (third verify level) which are respectively higher than the third, seven and eleventh reading voltages BLread, DLread and FLread (S408 in FIG. 33). The reading control circuit 501 causes the sense amplifier circuit to execute the B control process on the reading results (S409 in FIG. 33), and reads the results. Thus, the reading operation on the lower page and the middle page of the selecting memory cell MCn can be performed.

Next, a reading operation on an upper page will be described. The reading control circuit 501 selects the adjacent memory cell MCn+1 and reads the threshold distribution in the floating gate thereof at the first reading voltage Aread, the second reading voltage Bread and predetermined reading voltages Cread, Dread, Eread, Fread and Gread (S501 in FIG. 34).

Next, the reading control circuit 501 checks the LM flag n+1 of the adjacent memory cell MCn+1 (S502 in FIG. 34). When the LM flag n+1 is at the "L" level, the reading control circuit 501 selects the selecting memory cell MCn and reads the threshold distribution in the floating gate thereof at the first reading voltage Aread and predetermined reading voltages Cread, Eread and Gread (S503 in FIG. 34).

Then, the reading control circuit 501 checks the LM flag n of the selecting memory cell MCn (S504 in FIG. 34). When the LM flag n is at the "L" level, the reading control circuit 501 executes a process of forcibly setting the upper page to "1" (S509 in FIG. 34).

By contrast, when the LM flag n is at the "H" level, the reading control circuit 501 selects the selecting memory cell MCn, reads the threshold distribution in the floating gate thereof at a predetermined reading voltage ALread, which is lower than the first reading voltage Aread, and the fifth, ninth and thirteenth reading voltages CLread, ELread and GLread (S505 in FIG. 34), and causes the sense amplifier circuit to execute the A control process (S506 in FIG. 34).

Then, the reading control circuit 501 selects the selecting memory cell MCn, reads the threshold distribution in the floating gate thereof at a predetermined reading voltage AHread, which is higher than the first reading voltage Aread, and the sixth, tenth and fourteenth reading voltages CHread, EHread and GHread (S507 in FIG. 34), and causes the sense amplifier circuit to execute the B control process (S508 in FIG. 34). Thus, the reading operation on the upper page of the selecting memory cell MCn programmed in FIG. 32B can be performed.

As described above, when reading 8-value data from a selecting memory cell, the NAND type flash memory 500 reads data from a memory cell adjacent thereto and thus corrects the reading voltage for the selecting memory cell. Namely, the reading voltages of the first, second and third verify levels can be defined. Owing to this, the NAND type flash memory 500 can suppress the influence by the coupling noise and thus provide high reliability.

In Embodiment 5, the A control process and the B control process are executed by the sense amplifier circuits. The circuit configuration of such sense amplifier circuits is different from that of the sense amplifier circuits for executing the reading operation on the 4-value data described in Embodiment 1. Specifically, the sense amplifier circuits in Embodiment 5 each need to include one more latch circuit 501 in order to perform the reading operation for 8-value data. The provision of such an additional latch circuit can realize the A control process and the B control process for reading the 8-value data.

What is claimed is:

1. A nonvolatile semiconductor memory, comprising:
a memory cell array including a plurality of electrically writable memory cells;
a plurality of word lines and a plurality of bit lines connected to the plurality of memory cells; and
a data reading and programming control section for, when performing 4-value data programming, read or erasure with respect to at least one of the plurality of memory cells, selecting and applying a voltage to a corresponding word line and a corresponding bit line among the plurality of word lines and the plurality of bit lines;
wherein the memory cell array stores a plurality of flags related to a data programming state in each of the plurality of memory cells;
the data reading and programming control section includes:
an adjacent memory cell data reading section which confirms whether or not data is programmed in a lower page of a second memory cell adjacent to a first memory cell in the memory cell array using the flag corresponding to the second memory cell, and which generates adjacent memory cell state data which represents a data state of the second memory cell;
an adjacent memory cell data memory section for storing the adjacent memory cell state data generated by the adjacent memory cell data reading section;
a reading voltage level control section which controls each of a plurality of predetermined reading voltage verify levels to a reading voltage verify level added with a predetermined level when the 4-value data is read from the first memory cell when confirmed using the adjacent memory cell state data that data is programmed to the lower page of the second memory cell, and the reading voltage level control section which controls each of the predetermined plurality of reading voltage verify levels to a predetermined level when confirmed using the adjacent memory cell state data that data is not programmed to the lower page of the second memory cell;
a data reading section for reading the data from the first memory cell at a plurality of reading voltages corresponding to the plurality of predetermined reading voltage verify levels controlled using the reading voltage level control section; and
a data determining section for determining which data of 4-value data is programmed in the first memory cell based on the data which is read by the data reading section.

2. A nonvolatile semiconductor memory according to claim 1, wherein the adjacent memory cell data reading section confirms whether or not data is programmed in an upper page of the second memory cell using the flag corresponding to the second memory cell, and which generates adjacent memory cell state data which represents the data program state of the upper page of the second memory cell; and
the reading voltage level control section controls each of the plurality of reading voltage verify levels to a reading voltage verify level added with a predetermined level when confirmed using the adjacent memory cell state data that data is programmed to the upper page of the second memory cell, and the reading voltage level control section controls each of the predetermined plurality of reading voltage verify levels to a predetermined level when confirmed using the adjacent memory cell state data that data is not programmed to the upper page of the second memory cell.

3. A nonvolatile semiconductor memory according to claim 2, wherein the data determining section determines which data of the 4-value data is a combination of the data programmed in the lower page and the upper page of the first memory cell, based on the data which is read by the data reading section.

4. A nonvolatile semiconductor memory according to claim 1, wherein:
the reading voltage level control section defines first, second and third reading voltage levels, sequentially from the lowest level, in correspondence with values between threshold distributions of the 4-value data as reading voltage levels for reading the data from the first memory cell, before data is programmed to the second memory cell; and defines first and second reading voltage verify levels which are higher by a predetermined value than the second and third reading voltage levels for reading the data from the first memory cell, based on the adjacent memory cell state data; and
the data reading section reads the data from the first memory cell at a plurality of reading voltages corresponding to the first reading voltage level and the first and second reading voltage verify levels.

5. A nonvolatile semiconductor memory according to claim 4, wherein the data reading section reads the data from the first memory cell at a plurality of reading voltages corresponding to the first, second and third reading voltage levels and the first and second reading voltage verify levels.

6. A nonvolatile semiconductor memory according to claim 4, wherein the reading voltage level control section confirms whether or not data is programmed in an upper page of each of the first memory cell and the second memory cell using the flag corresponding to the first memory cell and the second memory cell respectively; and the data reading section reads the data from the first memory cell at a plurality of reading voltages corresponding to the plurality of predetermined reading voltage verify levels, or at a plurality of reading voltages corresponding to the first reading voltage level and the first and second reading voltage verify levels, based on the data program state of the upper page confirmed by the reading voltage level control section.

7. The non-volatile semiconductor memory device according to claim 1, wherein the reading voltage level control section changes in sequence the reading voltage level when read data from the lower page of the first memory cell to a third reading voltage level which is higher than a second reading voltage and a fourth reading voltage level which is higher than the third reading voltage level;

the data reading section reads data from the lower page of the first memory cell using a plurality of reading voltages corresponding to the third reading voltage level and the fourth reading voltage level which are changed in sequence by the reading voltage level control section; and the data determining section determines a voltage of the data read using a reading voltage corresponding to the fourth reading voltage level when a voltage of the data read using a read voltage corresponding to the third reading voltage level is determined as level "L".

8. A nonvolatile semiconductor memory, comprising:

a memory cell array including a plurality of electrically writable memory cells;

a plurality of word lines and a plurality of bit lines connected to the plurality of memory cells; and a data reading and programming control section for, when performing 8-value data programming, read or erasure with respect to at least one of the plurality of memory cells, selecting and applying a voltage to a corresponding word line and a corresponding bit line among the plurality of word lines and the plurality of bit lines;

wherein the memory cell array stores a plurality of flags related to a data programming state in each of the plurality of memory cells;

the data reading and programming control section includes:

an adjacent memory cell data reading section which confirms whether or not data is programmed in a lower page and a middle page of a second memory cell adjacent to a first memory cell in the memory cell array using the flag corresponding to the second memory cell, and which generates adjacent memory cell state data which represents a data state of the second memory cell;

an adjacent memory cell data memory section for storing the adjacent memory cell state data generated by the adjacent memory cell data reading section;

a reading voltage level control section which controls each of a plurality of predetermined reading voltage verify levels to a reading voltage verify level added with a predetermined level 8-value data is read from the first memory cell when confirmed using the adjacent memory cell state data that data is programmed to the lower page and the middle page of the second memory cell, and the reading voltage level control section which controls each of the predetermined plurality of reading voltage verify levels to a predetermined level when confirmed using the adjacent memory call state data that data is not programmed to the lower page and the middle page of the second memory cell;

a data reading section for reading the data from the first memory cell at a plurality of reading voltages corresponding to the plurality of predetermined reading voltage verify levels controlled using the reading voltage level control section; and a data determining section for determining which data of 8-value data is programmed in the first memory cell based on the data which is read by the data reading section.

9. A nonvolatile semiconductor memory according to claim 8, wherein the adjacent memory cell data reading section confirms whether or not data is programmed in an upper page of the second memory cell using the flag corresponding to the second memory cell, and which generates adjacent memory cell state data which represents the data programming state of the upper page of the second memory cell; and the reading voltage level control section controls each of the plurality of reading voltage verify levels to a reading voltage verify level added with a predetermined level when confirmed using the adjacent memory cell state data that data is programmed to the upper page of the second memory cell, and the reading voltage level control section controls each of the predetermined plurality of reading voltage verify levels to a predetermined level when confirmed using the adjacent memory cell state data that data is not programmed to the upper page of the second memory cell.

10. A nonvolatile semiconductor memory according to claim 9, wherein the data determining section determines which data of the 8-value data is a combination of the data programmed in the lower page, the middle page and the upper page of the first memory cell, based on the data which is read by the data reading section.

11. A nonvolatile semiconductor memory according to claim 8, wherein:

the reading voltage level control section defines first through fourteenth reading voltage levels, sequentially from the lowest level, in correspondence with values between threshold distributions of the 8-value data as reading voltage levels for reading the data from the first memory cell, before data is programmed to the second memory cell; and defines first, second and third reading voltage verify levels which are higher by a predetermined value than the third, seventh and eleventh reading voltage levels among the first through fourteenth reading voltage levels for reading the data from the first memory cell, based on the adjacent memory cell state data; and the data reading section reads the data from the first memory cell at a plurality of reading voltages corresponding to the first reading voltage level and the first, second and third reading voltage verify levels.

12. A nonvolatile semiconductor memory according to claim 11, wherein the data reading section reads the data from the first memory cell at a plurality of reading voltages corresponding to the first through fourteenth reading voltage levels and the first, second and third reading voltage verify levels.

13. A nonvolatile semiconductor memory according to claim 11, further comprising an upper page state memory section for storing upper page state data which represents whether or not data is programmed in an upper page of each of the first memory cell and the second memory cell;
   wherein the data reading section reads the data from the first memory cell at a plurality of reading voltages corresponding to the plurality of predetermined reading voltage verify levels, or at a plurality of reading voltages corresponding to the first through fourteenth reading voltage levels and the first, second and third reading voltage verify levels, based on the upper page state data stored in the upper page state memory section.

14. A data reading method in a nonvolatile semiconductor memory, the nonvolatile semiconductor memory comprising:
   a memory cell array including a plurality of electrically writable memory cells;
   a plurality of word lines and a plurality of bit lines connected to the plurality of memory cells; and
   a data reading and programming control section for, when performing 4-value data programming, read or erasure with respect to at least one of the plurality of memory cells, selecting and applying a voltage to a corresponding word line and a corresponding bit line among the plurality of word lines and the plurality of bit lines;
   the method comprising:
   storing a plurality of flags in the memory cell array, the plurality of flags being related to a data programming state in each of the plurality of memory cells;
   confirming whether or not data is programmed in a lower page of a second memory cell adjacent to a first memory cell using the flag corresponding to the second memory cell and generating adjacent memory cell state data which represents a data state of the second memory cell;
   storing the adjacent memory cell state data in an adjacent memory cell data memory section;
   controlling each of a plurality of predetermined reading voltage verify levels to a reading voltage verify level added with a predetermined level when the 4-value data is read from the first memory cell when confirmed using the adjacent memory cell state data in the adjacent memory cell storage section that data is programmed to the lower page of the second memory cell, and controlling each of the predetermined plurality of reading voltage verify levels to a predetermined level when confirmed using the adjacent memory cell state data in the adjacent memory cell storage section that data is not programmed to the lower page of the second memory cell;
   reading the data from the first memory cell at a plurality of reading voltages corresponding to the controlled plurality of predetermined reading voltage verify levels; and
   determining which data of 4-value data is programmed in the first memory cell based on the data which is read by the data reading section.

15. A data reading method according to claim 14, comprising reading, confirming whether or not data is programmed in an upper page of the second memory cell using the flag corresponding to the second memory cell, and generating adjacent memory cell state data which represents the data program state of the second memory cell; and
   controlling each of a plurality of predetermined reading voltage verify levels to a reading voltage verify level added with a predetermined level when confirmed using the adjacent memory cell state data that data is programmed to the upper page of the second memory cell, and controlling each of the predetermined plurality of reading voltage verify levels to a predetermined level when confirmed using the adjacent memory cell state data that data is not programmed to the upper page of the second memory cell.

16. A data reading method according to claim 15, comprising determining which data of the 4-value data is a combination of the data programmed in the lower page and the upper page of the first memory cell, based on the data which is read by the data reading section.

17. A data reading method according to claim 14, comprising:
   defining first, second and third reading voltage levels, sequentially from the lowest level, in correspondence with values between threshold distributions of the 4-value data as reading voltage levels for reading the data from the first memory cell, before data is programmed to the second memory cell; and defining first and second reading voltage verify levels which are higher by a predetermined value than the second and third reading voltage levels for reading the data from the first memory cell, based on the adjacent memory cell state data; and
   reading the data from the first memory cell at a plurality of reading voltages corresponding to the first reading voltage level and the first and second reading voltage verify levels.

18. A data reading method according to claim 17, comprising reading the data from the first memory cell at a plurality of reading voltages corresponding to the first, second and third reading voltage levels and the first and second reading voltage verify levels.

19. A data reading method according to claim 17, comprising confirming whether or not data is programmed in an upper page of each of the first memory cell and the second memory cell using each flag corresponding to the first memory cell and the second memory cell; and
   reading the data from the first memory cell at a plurality of reading voltages corresponding to the plurality of predetermined reading voltage verify levels, or at a plurality of reading voltages corresponding to the first reading voltage level and the first and second reading voltage verify levels, based on the confirmed data program state of the upper page.

20. A data reading method according to claim 14, wherein the nonvolatile semiconductor memory comprises a data reading and programming control section for, when performing 8-value data programming, read or erasure with respect to at least one of the plurality of memory cells, selecting and applying a voltage to a corresponding word line and a corresponding bit line among the plurality of word lines and the plurality of bit lines;
   the method comprising:
   storing a plurality of flags in the memory cell array, the plurality of flags being related to a data programming state in each of the plurality of memory cells;
   confirming whether any of the 8-value data is programmed in a lower page and a middle page of a second memory cell adjacent to a first memory cell using the flag corresponding to the second memory cell and generating adjacent memory cell state data which represents a data state of the second memory cell;
   storing the adjacent memory cell state data in the adjacent memory cell data memory section;
   controlling each of a plurality of predetermined reading voltage verify levels when reading the 8-value data from the first memory cell based on the adjacent memory cell state data;

reading the data from the first memory cell at a plurality of reading voltages corresponding to the controlled plurality of predetermined reading voltage verify levels; and determining which data of the 8-value data is programmed in the first memory cell based on the data which is read by the data reading section.

21. A data reading method according to claim 20, comprising:

defining first through fourteenth reading voltage levels, sequentially from the lowest level, in correspondence with values between threshold distributions of the 8-value data as reading voltage levels for reading the data from the first memory cell, before data is programmed to the second memory cell; and defining first, second and third reading voltage verify levels which are higher by a predetermined value than the third, seventh and eleventh reading voltage levels among the first through fourteenth reading voltage levels for reading the data from the first memory cell, based on the adjacent memory cell state data;

reading the data from the first memory cell at a plurality of reading voltages corresponding to the first reading voltage level and the first, second and third reading voltage verify levels; and determining which data of the 8-value data is a combination of the data programmed in the lower page, the middle page and the upper page of the first memory cell, based on the data which is read by the data reading section.

22. The data read method according to claim 14, wherein the reading voltage level when data is read from the lower page of the first memory cell is changed in sequence to a third reading voltage level which is higher than a second reading voltage level and a fourth reading voltage level which is higher than the third reading voltage level; and a voltage of the data read using a reading voltage corresponding to the fourth reading voltage level is not determined when a voltage of the data read using a reading voltage corresponding to the third reading voltage level is determined as level "L".

* * * * *